United States Patent

Hatori et al.

[11] Patent Number: 6,156,433
[45] Date of Patent: Dec. 5, 2000

[54] ELECTRODE FOR PLASMA DISPLAY PANEL AND PROCESS FOR PRODUCING THE SAME

[75] Inventors: Sakurako Hatori; Yasunori Kurima; Nobuaki Kimura; Yozo Kosaka; Satoru Kuramochi, all of Tokyo-To, Japan

[73] Assignee: Dai Nippon Printing Co., Ltd., Japan

[21] Appl. No.: 08/787,744

[22] Filed: Jan. 24, 1997

[30] Foreign Application Priority Data

| Jan. 26, 1996 | [JP] | Japan | 8-011468 |
| Jun. 3, 1996 | [JP] | Japan | 8-140044 |
| Jul. 26, 1996 | [JP] | Japan | 8-215324 |
| Oct. 11, 1996 | [JP] | Japan | 8-289073 |

[51] Int. Cl.⁷ .............. B32B 9/04; G03C 11/00; G03C 1/76; G03C 5/00
[52] U.S. Cl. ............ 428/411.1; 428/914; 430/198; 430/271.1; 430/256; 430/319; 430/320; 430/325; 430/311; 430/312; 430/315; 430/15
[58] Field of Search .................... 428/913, 914, 428/328, 411.1; 429/209, 218, 219, 220, 223; 430/312, 252, 496, 502, 198, 271.1, 256, 319, 320, 325, 311, 315, 15

[56] References Cited

U.S. PATENT DOCUMENTS

| 4,211,560 | 7/1980 | Taguchi et al. | 430/313 |
| 4,650,288 | 3/1987 | White | 350/362 |
| 4,692,662 | 9/1987 | Wada et al. | 313/493 |
| 5,009,972 | 4/1991 | Higuchi et al. | 430/7 |
| 5,049,482 | 9/1991 | Nebe et al. | 430/281 |
| 5,209,688 | 5/1993 | Nishigaki et al. | 445/24 |
| 5,385,795 | 1/1995 | Yuasa et al. | 430/7 |
| 5,419,991 | 5/1995 | Segawa | 430/20 |
| 5,532,105 | 7/1996 | Yamadera et al. | 430/156 |
| 5,548,186 | 8/1996 | Ota | 313/583 |
| 5,593,802 | 1/1997 | Sato et al. | 430/20 |
| 5,672,460 | 9/1997 | Katoh et al. | 430/198 |
| 5,804,917 | 9/1998 | Takahashi et al. | 313/504 |

FOREIGN PATENT DOCUMENTS 4-272634   9/1992   Japan .

*Primary Examiner*—Paul Thibodeau
*Assistant Examiner*—Holly C. Rickman
*Attorney, Agent, or Firm*—Parkhurst & Wendel, L.L.P

[57] ABSTRACT

An electrode, for a plasma display panel, adapted for provision on a front or back plate of a plasma display panel, the electrode comprising a conductive paste.

20 Claims, 23 Drawing Sheets

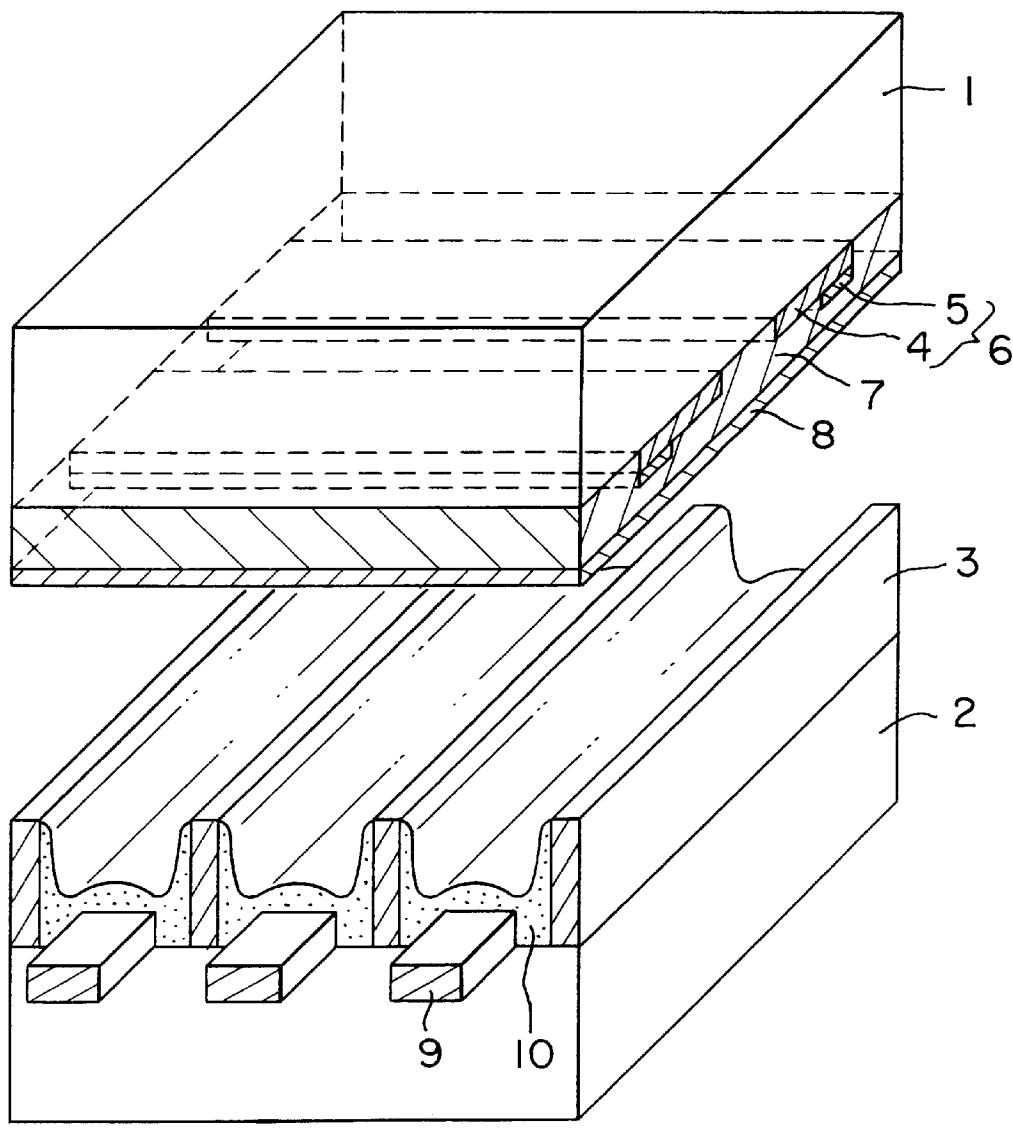
F I G. 1

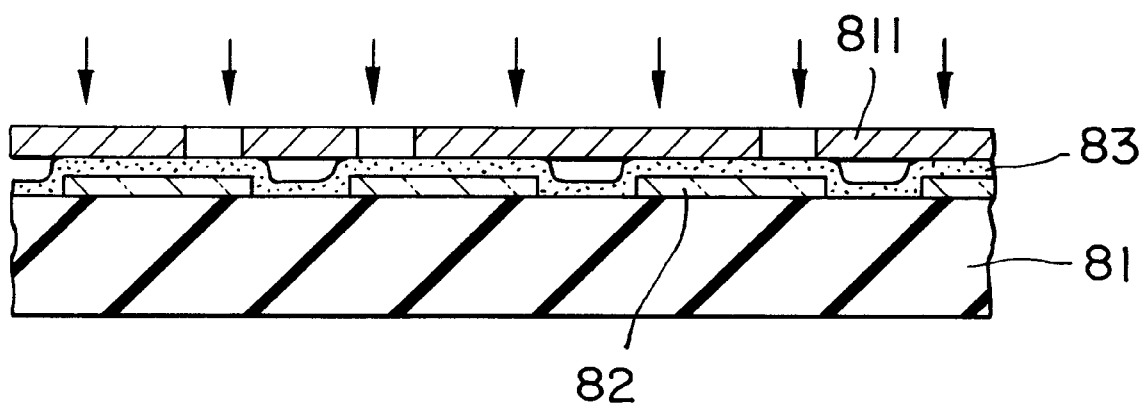
F I G. 9A
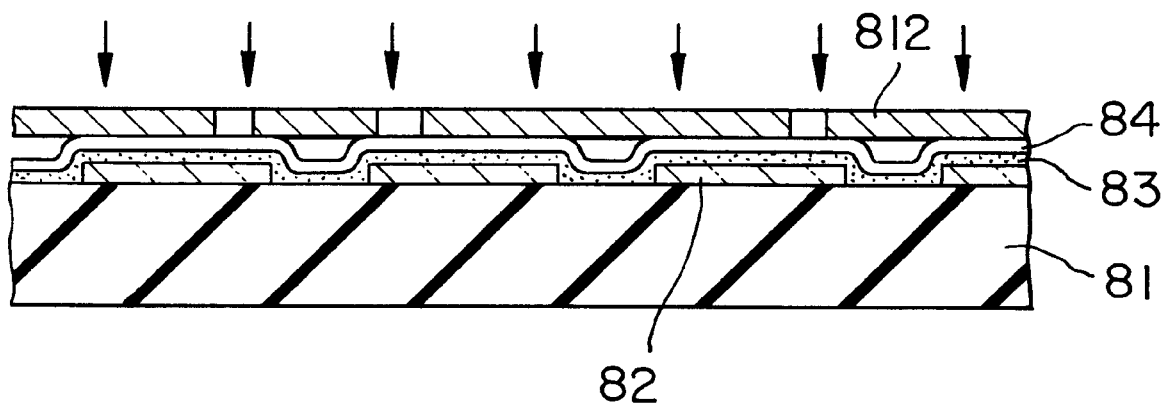
F I G. 9B
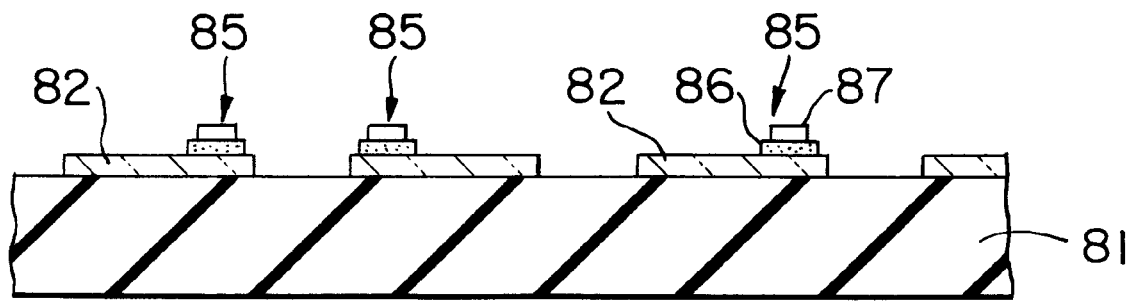
F I G. 9C

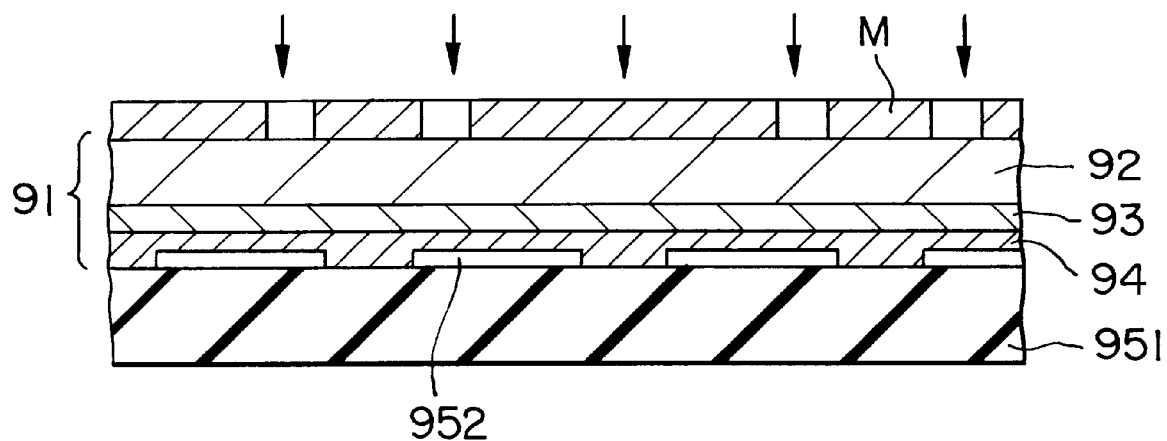
F I G. 15 A
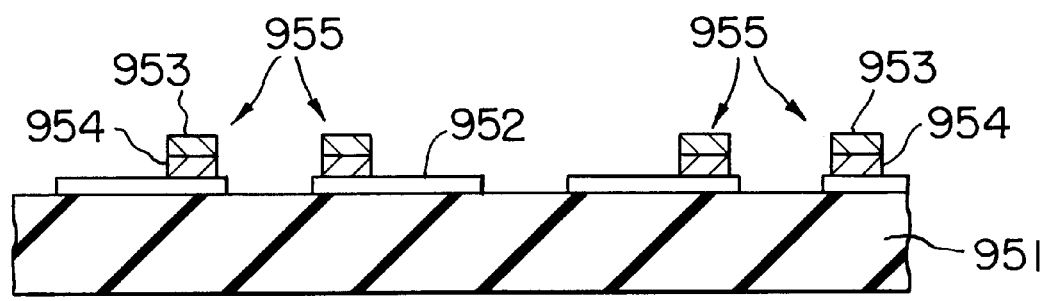
F I G. 15 B

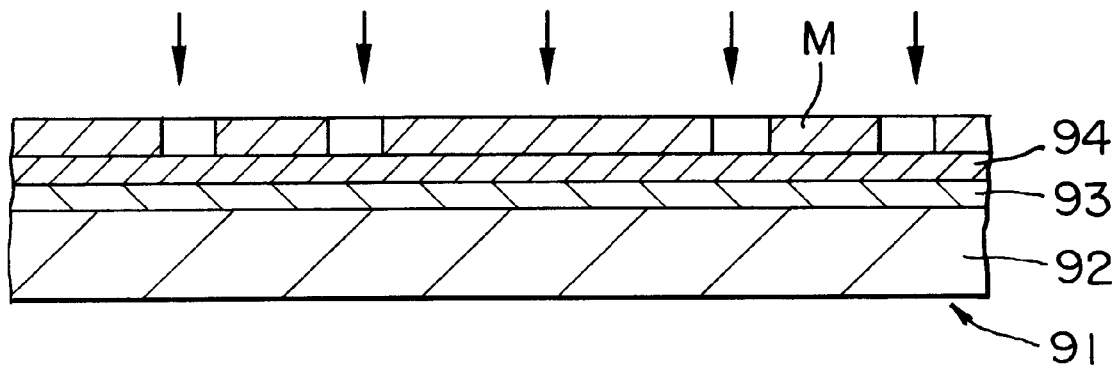
F I G. 17A
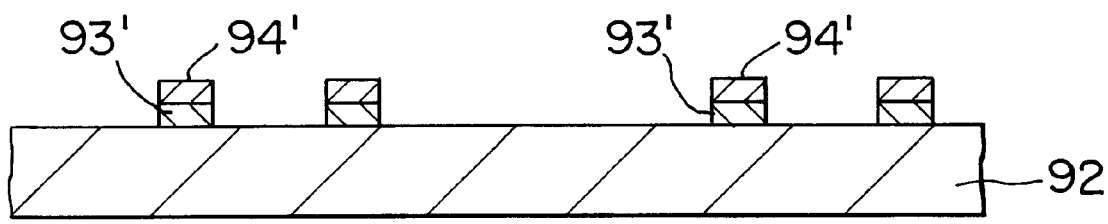
F I G. 17B
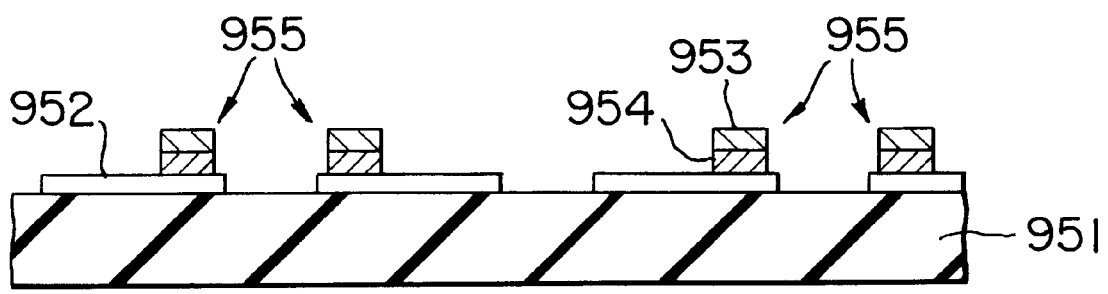
F I G. 17C

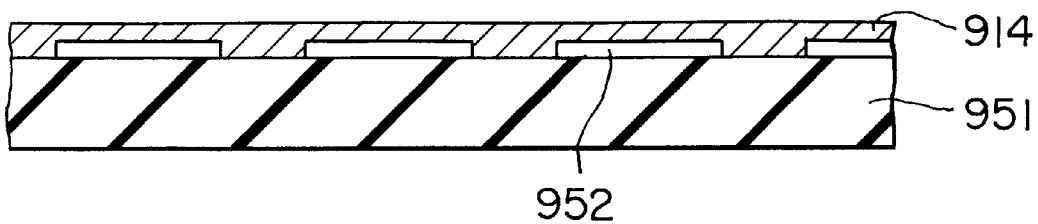
F I G. 18 A
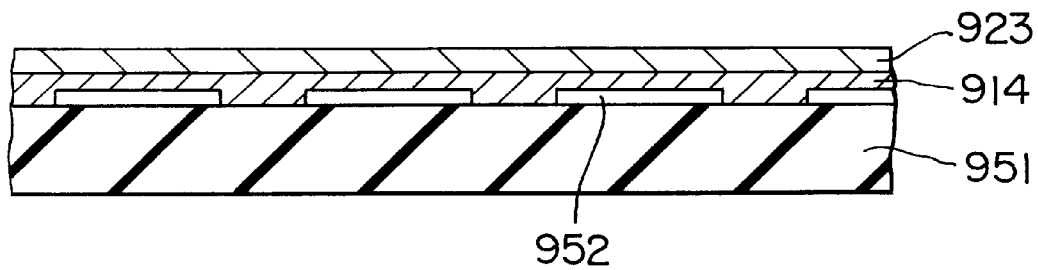
F I G. 18 B
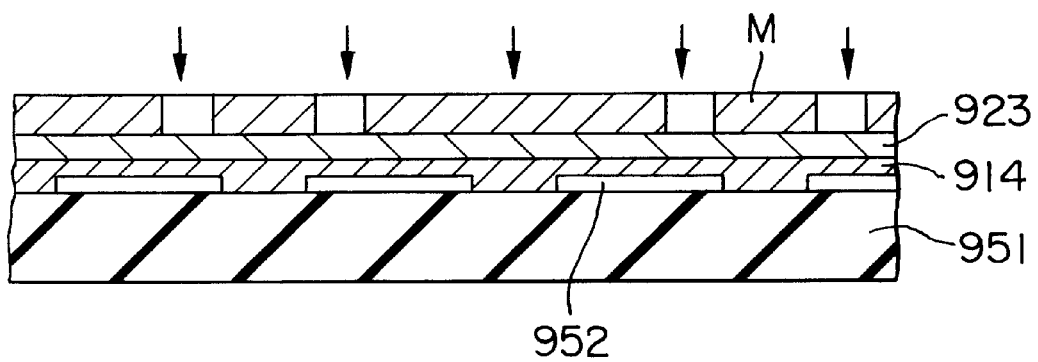
F I G. 18 C
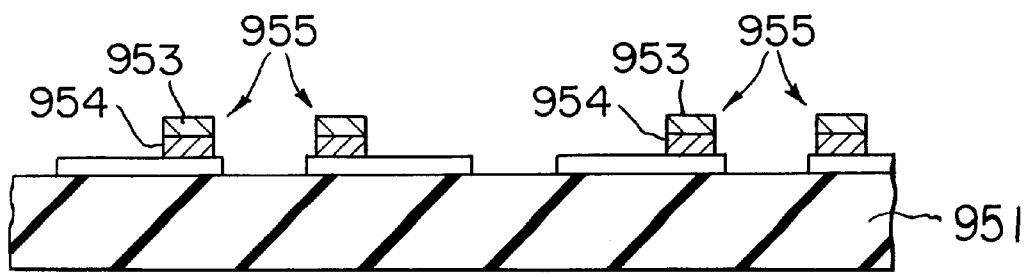
F I G. 18 D

ELECTRODE FOR PLASMA DISPLAY PANEL AND PROCESS FOR PRODUCING THE SAME

BACKGROUND OF THE INVENTION

The present invention relates to a plasma display panel (hereinafter often referred to as "PDP") which is a plate display of a self-activation luminescence type using gas discharge, and more particularly to an electrode to be provided on a front or back plate of PDP.

In general, PDP comprises: two opposed glass substrates; a pair of electrodes systematically arranged in the glass substrates; and a gas (mainly Ne or the like) sealed therebetween. A voltage is applied across the electrodes to produce discharge within minute cells around the electrodes to emit light from each cell, thereby displaying information. Systematically arranged cells are selectively subjected to discharge luminescence in order to display information. Such PDPs are classified into two types, a direct current type PDP, wherein electrodes are exposed to a discharge space (DC type), and an alternating current type (AC type) wherein electrodes are covered with an insulating layer. Each of these types is further classified into a refresh drive system and a memory drive system according to display functions and drive systems.

FIG. 1 shows an embodiment of the construction of an AC type PDP. In the drawing, the front plate and the back plate are shown separately from each other. As shown in the drawing, two glass substrates 1, 2 are arranged parallel and opposite to each other. Both the substrates are disposed so as to be held, while leaving a given space therebetween, by means of cell barriers 3 provided, parallel to each other, on the glass substrate 2 as a back plate. Composite electrodes 6 each comprising a sustaining electrode 4 as a transparent electrode and a bus electrode 5 as a metallic electrode are provided parallel to each other on the back side of the glass substrate 1 as the front plate, and a dielectric layer 7 is provided so as to cover the composite electrode. Further, a protective layer 8 (MgO layer) is provided on the surface of the dielectric layer 7. On the other hand, address electrodes 9 are provided between the cell barriers 3 on the front side of the glass substrate 2 as the back plate so that the address electrodes 9 are parallel to each other and orthogonal to the composite electrodes 6. Further, a phosphor 10 is provided so as to cover the wall surface of the cell barriers 3 and the bottom face of cells. The AC type PDP is of a plane discharge type and constructed so that an alternating voltage is applied across the composite electrodes on the front plate and an electric field leaked in the space produces discharge. In this case, since the alternating voltage is applied, the direction of the electric field changes according to the frequency. Ultraviolet light produced by the discharge permits the phosphor 10 to emit light, and light transmitted through the front plate is viewed by an observer.

Regarding the composite electrode 6 on the front plate of the AC-type PDP, it should be noted that sole use of the sustaining electrode 4 results in high resistance value, and, hence, the bus electrode 5 is formed on the sustaining electrode 4 in order to lower the resistance value. ITO, $SnO_2$, ZnO and the like are considered as a material for the sustaining electrode 4. In general, however, ITO is used from the viewpoints of easy film formation and patterning. On the other hand, the bus electrode is formed of a metallic material. When it is constituted by a single layer of a thin metallic film, use of a material having low resistivity, for example, Cu or Al, is considered from the viewpoint of resistance value required of the bus electrode 5. Cu, when used for the bus electrode, has poor adhesion to ITO as a layer underlying the bus electrode 5 and, in addition, as a result of firing in the formation of a dielectric layer 7 in the subsequent step, is thermally oxidized resulting in increased resistance value. On the other hand, use of Al poses a problem that the firing in the subsequent step results in thermal oxidation of the material or the roughening of the surface. Therefore, it is common practice to construct the bus electrode 5 out of a combination of dissimilar metallic materials, such as Cr/Cu/Cr or Cr/Al/Cr, rather than a single layer of a metallic thin film. In this case, Cr constituting a lower layer functions as a layer for adhesion to the underlying sustaining electrode 4, and Cr constituting an upper layer functions as a layer for antioxidation of overlying Cu or Al. The use of the above laminate structure and materials is not limited to the electrode of the above AC type PDP but applicable also to the electrode of the DC type PDP for the same reason described above in connection with the electrode of the AC type PDP. The adoption of the above laminate structure does not pose a problem associated with the single metallic layer. It, however, requires a thin film forming technique, such as sputtering or vapor deposition, and etching three times in the formation of the bus electrode, rendering the process complicated, which in turn takes a lot of time and results in unsatisfactory throughput capacity.

In view of the above, the present invention has been made, and an object of the present invention is to provide a PDP electrode which can be prepared by a simple process, and a process for producing the same.

Another object of the present invention is to provide means for forming an electrode which can realize a high display quality even in a high-definition or large-area plasma display panel.

DISCLOSURE OF THE INVENTION

Under the above circumstances, the present invention has been made, and basically, the present invention provides an electrode, for a plasma display panel, adapted for provision on a front or back plate of a plasma display panel, the electrode comprising a conductive paste. In particular, the electrode of the present invention is characterized by comprising a black pigment.

Further, the present invention provides a particular thick film production process as an excellent process for producing the above electrode layer.

Furthermore, in order to improve the above electrode, the present invention provides an electrode having therein a particular two layer structure and an electrode production process involving transfer.

BRIEF DESCRIPTION OF THE DRAWINGS

FIG. 1 is a cross-sectional view showing one embodiment of the construction of an AC type plasma display panel;

FIGS. 9A to 9C are a process diagram showing another embodiment of the process for producing a plasma display panel according to the present invention;

FIGS. 15A and 15B,

FIGS. 17A to 17C,

FIGS. 18A to 18D,

BEST MODE FOR CARRYING OUT THE INVENTION

[A] Composite electrode for PDP

Figure 2A:
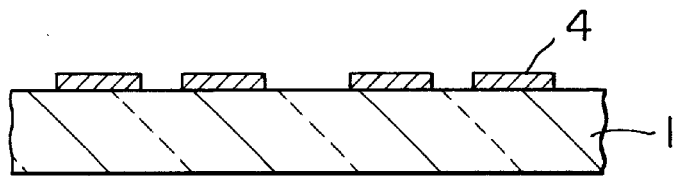
FIGS. 2A to 2D are a process diagram showing a first embodiment for forming a composite electrode on a front plate.

The electrode for a plasma display panel according to the present invention is an electrode, for a plasma display panel, adapted for provision on a front or back plate of a plasma display panel, the electrode comprising a conductive paste.

According to the present invention, the above conductive paste may be in the form of a sheet prepared by coating a conductive paste and drying the coating.

Further, according to the present invention, a black pigment may be incorporated into the conductive paste so that the conductive paste serves also as a black matrix.

A transparent electrode of a transparent conductive film may be provided between the electrode and a substrate to form a composite electrode structure.

The electrode may be prepared by any of screen printing using a conductive paste, etching of a conductive material, filling of a conductive paste, and photolithography using a photosensitive conductive material.

A composition comprising, on a solid basis (i.e., excluding a solvent), 98 to 60% by weight (90 to 60% by weight in the case of a photosensitive material), preferably 90 to 75% by weight, of a metallic powder, 2 to 40% by weight (10 to 40% in the case of a photosensitive material), preferably 10 to 25% by weight of an organic solid matter may be used as the conductive paste. Preferably, the metallic powder as the conductive component is selected from the group consisting of powders of Ag, Au, Ni, Cu, Ag—Pd, and Al.

Preferred binders usable herein include a polymer of one member or a copolymer of at least two members selected from methyl acrylate, methyl methacrylate, ethyl acrylate, ethyl methacrylate, n-propyl acrylate, n-propyl methacrylate, isopropyl acrylate, isopropyl methacrylate, sec-butyl acrylate, sec-butyl methacrylate, isobutyl acrylate, isobutyl methacrylate, tert-butyl acrylate, tert-butyl methacrylate, hydroxyethyl acrylate, hydroxyethyl methacrylate, hydroxypropyl acrylate, hydroxypropyl methacrylate and the like; ethyl cellulose, a polybutene derivative; and styrene and $\alpha$-methylstyrene.

In the present invention, the conductive paste may further comprise a black pigment. The incorporation of the black pigment permits the conductive paste to function also as a black matrix. Further, use may be made of a laminate structure of a black conductive layer containing a black pigment and a conductive layer not containing a black pigment.

In the case of a composite electrode of a laminate of the above electrode and a transparent electrode, the first layer of a transparent conductive film for the transparent electrode may be made of ITO, $SnO_2$, ZnO or the like. Among them, ITO and $SnO_2$ are preferred as the material for the transparent electrode.

The transparent conductive film may be formed, for example, by forming a transparent conductive film on a glass substrate as the substrate and patterning the transparent conductive film by photolithography to create a predetermined pattern.

In the above composite electrode, the second layer may be formed by screening using a conductive paste, etching, or filling using a conductive paste. Specific embodiments of these methods will be described in detail in working examples described below. The formation of the second layer by photolithography using a photosensitive paste is also possible. In this case, a method, described below, is particularly preferred which comprises the steps of: once forming a photosensitive paste into a film; laminating the film onto a substrate; and patterning the film by photolithography.

The composition and properties of the conductive paste will be described later. They are described in more detail also in the following description in connection with the composite electrodes having a two layer structure. These compositions and production processes are applicable to the present invention.

[B] Process for producing electrode pattern

Processes which are considered usable for the production of an electrode of PDP include one wherein a film of an electrode material is formed on a substrate by the above-described vacuum deposition, sputtering, plating, thick film formation or the like and the film is patterned by photolithography and one wherein patterning is performed by screen printing using a thick paste film. The former method, i.e., the method using photolithography, has an advantage of high pattern accuracy. It, however, is disadvantageous in that the formation of a film by vacuum deposition or sputtering has poor mass productivity, resulting in increased cost. The formation of a film by plating disadvantageously involves many steps.

Accordingly, an object of the present invention is to provide a process for producing an electrode pattern which enables a pattern to be formed with a high accuracy by simple steps.

In order to attain the above object, the process for producing an electrode pattern as a first type of pattern according to the present invention comprises at least the following steps:

(1) the first step of forming previously coating a photosensitive paste on a film to form a pattern forming layer on the film;

(2) the second step of laminating the film onto a substrate so that the pattern forming layer faces the substrate;

(3) the third step of exposing the pattern forming layer from above the film through a predetermined mask;

(4) the fourth step of separating and removing the film and developing the pattern forming layer to remove unexposed areas; and (5) the fifth step of firing the whole substrate to adhere the pattern forming layer in its exposed areas to the substrate.

Further, in order to attain the same object, the process for producing a thick film pattern as a second type of pattern comprises at least the following steps:

(1) the first step of forming previously coating a photosensitive paste on a film to form a pattern forming layer on the film;

(2) the second step of laminating the film onto a substrate so that the pattern forming layer faces the substrate;

(3) the third step of separating and removing the film and exposing the pattern forming layer through a predetermined mask;

(4) the fourth step of developing the pattern forming layer to remove unexposed areas; and (5) the fifth step of firing the whole substrate to adhere the pattern forming layer in its exposed areas to the substrate.

According to the present invention, when the substrate is a glass substrate, an address electrode for PDP may be formed. On the other hand, when the substrate has thereon a patterned transparent conductive film, a composite electrode (a bus electrode) for PDP may be formed.

FIG. 7 is a process diagram showing an embodiment of the process for producing an electrode pattern according to the present invention.

Figure 7A:
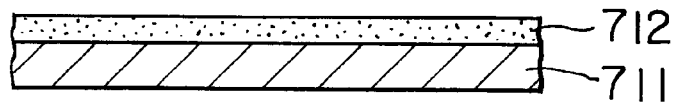
FIGS. 7A to 7E are a process diagram showing one embodiment of the process for producing a thick film pattern according to the present invention.

As shown in FIG. 7A, a photosensitive paste is coated on a film 711 as a flexible substrate, and the coating is dried to form a pattern forming layer 712. Films usable as the film 711 include polyethylene terephthalate (PET), adhesive PET, silicone-treated PET, acrylmelamine-treated PET, wax-treated PET, stretched polyethylene, polyethylene, stretched polypropylene, polypropylene, triacetyl cellulose, polystyrene, polyethylene naphthalate, polyimide and other films. The thickness of the film 711 is suitably 6 to 200 $\mu$m. When the thickness is less than 6 $\mu$m, the nerve is low resulting in poor workability and remarkable curling. On the other hand, when it is more than 200 $\mu$m, the film is heavy, making it difficult to roll. The photosensitive paste may be coated on the film 711 by any suitable means such as roll coating, die coating, slip coating, doctor blade coating, Komma coating, or gravure coating.

When the thick film pattern is intended to be used as an electrode, a conductive paste comprising a photosensitive resin component and a conductive powder (such as Au, Ag, Cu, Ni, or Al) and optionally a glass frit and an inorganic pigment is used as the photosensitive paste.

The proportion of the inorganic component (glass frit, metallic powder, inorganic pigment or the like) to the photosensitive resin component (negative-working type) in the photosensitive paste is such that the amount of the photosensitive resin component is 10 to 100 parts by weight, preferably 10 to 50 parts by weight, based on 100 parts by weight of the inorganic component. When the amount of the photosensitive resin component is smaller than 10 parts by weight, it is impossible to perform patterning, while when it is larger than 100 parts by weight, sintering does not provide any dense structure, making it impossible to offer contemplated properties. Preferably, the glass frit used has a softening point of 400 to 650° C. and an average particle diameter of 0.1 to 10 $\mu$m. A mixture of two or more glass frits may also be used.

The photosensitive resin component comprises an alkali-developable binder polymer and a reactive monomer and, if necessary, may further comprise an initiator, a sensitizer, a polymerization terminator, a chain transfer agent, a defoamer, a leveling agent, a dispersant, a plasticizer, a stabilizer and the like.

Alkali-developable binder polymers usable herein include, but are not limited to a copolymer of at least one member, selected from acrylic acid, methacrylic acid, a dimer of acrylic acid (M-5600, manufactured by Toa Gosei Chemical Industry Co., Ltd.), itaconic acid, crotonic acid, maleic acid, fumaric acid, vinylacetic acid, and acid anhydrides of the above compounds, with at least one member selected from methyl acrylate, methyl methacrylate, ethyl acrylate, ethyl methacrylate, n-propyl acrylate, n-propyl methacrylate, isopropyl acrylate, sec-butyl acrylate, sec-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, styrene, α-methylstyrene, and N-vinyl-2-pyrrolidone, the copolymer having an acid value of 50 to 200 mg KOH/g. The copolymers may be used alone or as a mixture of two or more. Polymers comprising an ethylenically unsaturated compound having a glycidyl or hydroxyl group added to the above copolymers, the polymers having an acid value of 50 to 200 mg KOH/g, may also be used. They may be used alone or as a mixture of two or more. At least one non-alkali-developable polymer may be blended with the above polymers. Non-alkali-developable polymers usable herein include polyvinyl alcohol, polyvinyl butyral, acrylic ester polymer, methacrylic ester polymer, polystyrene, α-methylstyrene polymer, 1-vinyl-2-pyrrolidone polymer, and copolymers thereof.

The reactive monomer may be a compound having at least one polymerizable carbon-carbon unsaturated bond, and specific examples thereof include allyl (meth)acrylate, benzyl (meth)acrylate, butoxyethyl (meth)acrylate, butoxyethylene glycol (meth)acrylate, cyclohexyl (meth)acrylate, dicyclopentanyl (meth)acrylate, dicyclopentenyl (meth)acrylate, 2-ethylhexyl (meth)acrylate, glycerol (meth)acrylate, glycidyl (meth)acrylate, 2-hydroxyethyl (meth)acrylate, 2-hydroxypropyl (meth)acrylate, isobornyl (meth)acrylate, isodexyl (meth)acrylate, isooctyl (meth)acrylate, lauryl (meth)acrylate, 2-methoxyethyl (meth)acrylate, methoxyethylene glycol (meth)acrylate, phenoxyethyl (meth)acrylate, stearyl (meth)acrylate, ethylene glycol di(meth)acrylate, diethylene glycol di(meth)acrylate, 1,4-butanediol di(meth)acrylate, 1,5-pentanediol di(meth)acrylate, 1,6-hexanediol di(meth)acrylate, 1,3-propanediol di(meth)acrylate, 1,4-cyclohexanediol di(meth)acrylate, 2,2-dimethylolpropane di(meth)acrylate, glycerol di(meth)acrylate, tripropylene glycol di(meth)acrylate, glycerol tri(meth)acrylate, trimethylolpropane tri(meth)acrylate, polyoxyethylated trimethylolpropane tri(meth)acrylate, pentaerythritol tri(meth)acrylate, pentaerythritol tetra(meth)acrylate, triethylene glycol di(meth)acrylate, polyoxypropyl trimethylolpropane tri(meth )acrylate, butylene glycol di(meth)acryl ate, 1,2,4-butanetriol tri(meth)acrylate, 2,2,4- trimethyl-1,3-pentanediol di(meth)acrylate, diallyl fumarate, 1,10-decanediol dimethyl (meth)acrylate, dipentaerythritol hexa(meth)acrylate, γ-methacryloxypropyltrimethoxysilane, and 1-vinyl-2-pyrrolidone. In the present invention, these monomers may be used alone or a mixture of two or more of them, or alternatively may be used in the form of other compounds.

Photopolymerization initiators to be added for constituting the photosensitive resin component include benzophenone, methyl o-benzoylbenzoate, 4,4-bis (dimethylamine)benzophenone, 4,4-bis(diethylamine) benzophenone, α-amino-acetophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyl dimethyl ketal, benzyl methoxyethyl acetal, benzoin methyl ether, benzoin butyl ether, anthraquinone, 2-tert-butylanthraquinone, 2-amylanthraquinone, β-chloroanthraquinone, anthrone, benzanthrone, dibenzsuberone, methyleneanthrone, 4-azidobenzylacetophenone, 2,6-bis(p-azidobenzylidene) cyclohexane, 2,6-bis(p-azidobenzylidene)-4-methylcyclohexanone, 2-phenyl-1,2-butanedion-2-(o-methoxycarbonyl)oxime, 1-phenyl-propanedion-2-(o-ethoxycarbonyl)oxime, 1,3-diphenyl-propanetrion-2-(o-ethoxycarbonyl)oxime, 1-phenyl-3-ethoxy-propanetrion-2-(o-benzoyl)oxime, Michler's ketone, 2-methyl-[4-(methylthio)phenyl]-2-morpholino-1-propane, naphthalene sulfonyl chloride, quinoline sulfonyl chloride, n-phenylthioacridone, 4,4-azobisisobutyronitrile, diphenyl disulfide, benzthiazole disulfide, triphenylphosphine, camphorquinone, carbon tetrabromide, tribromophenylsulfone, benzoin peroxide, and a combination of a photoreducible dye, such as eosine or Methylene Blue, with a reducing agent, such as ascorbic acid or triethanolamine. In the present invention, these photopolymerization initiators may be used alone or as a mixture of two or more.

When the volatile or decomposition temperature exceeds 600° C., high temperature is required for removing the resin component after exposure and development of the photosensitive black conductive paste coating and the photosensitive conductive paste coating, which, for example, when the heat resistance of the insulating plate 1 is low, thermal deformation is unfavorably created in the substrate. On the other hand, there is no particular limitation on the volatilization or decomposition temperature. However, the lower the volatilization or decomposition temperature, the smaller the number of kinds of completely volatilizable or decomposable resins and, hence, the narrower the range of selectable materials. For this reason, the lower limit of the volatilization or decomposition temperature of the photosensitive resin component is preferably, for example, about 200° C.

The content of the photosensitive resin component in the photosensitive conductive paste is preferably 5 to 40% by weight.

The photosensitive conductive paste used in the present invention may further comprise optional additives, such as a sensitizer, a polymerization terminator, a chain transfer agent, a leveling agent, a dispersant, plasticizer, a stabilizer, and a defoamer.

Solvents usable herein include methanol, ethanol, isopropanol, acetone, methyl ethyl ketone, toluene, xylene, cyclohexanone, methylene chloride, 3-methoxybutyl acetate, ethylene glycol monoalkyl ethers, ethylene glycol dialkyl ethers, diethylene glycol monoalkyl ethers, diethylene glycol monoalkyl ether acetates, propylene glycol monoalkyl ethers, propylene glycol dialkyl ethers, propylene glycol monoalkyl acetates, dipropylene glycol monoalkyl ethers, dipropylene glycol dialkyl ethers, dipropylene glycol monoalkyl ether acetates, and terpenes such as α- or β-terpineol. They may be used alone or as a mixture of two or more.

Figure 7B:
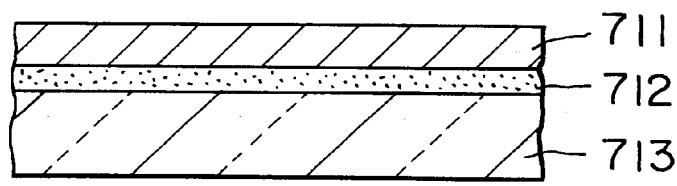
Figure 7C:
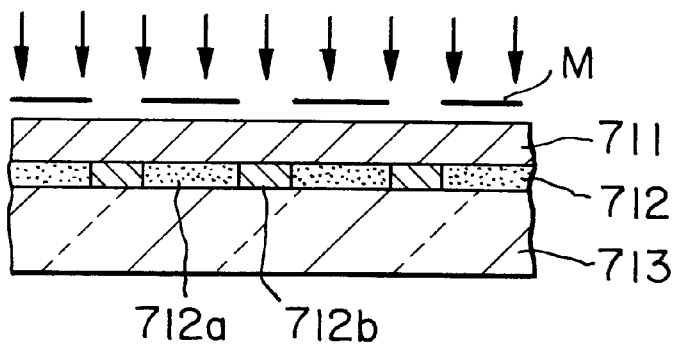

As shown in FIG. 7B, the film 711 having thereon the pattern forming layer 712 is laminated onto a glass substrate 713 so that the pattern forming layer 712 faces the glass substrate 713. Thereafter, as shown in FIG. 7C, the pattern forming layer 712 is exposed from above the film 711 through a predetermined mask M. In this case, an ionizing radiation, such as electron beam, ultraviolet radiation, or X-radiation, is used as a light source. The exposure of the pattern forming layer 712 causes the pattern forming layer 712 to be separated into an unexposed area 712a and an exposed area 712b. As shown in the drawing, when the exposure is performed with the mask M in intimate contact with the film 711 without removing the film 711, the fusion effect of oxygen offers an improvement in sensitivity (shortening of exposure time) and other effects. Further, when the photosensitive paste material has an adhesive property, exposure with the mask adhered to the film 711 without removing the film 711 is effective.

Figure 7D:
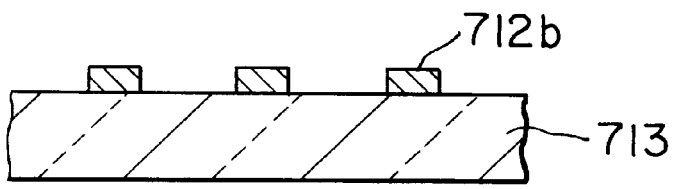
Figure 7E:
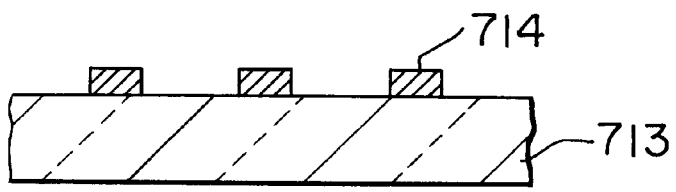

Subsequently, the film is separated and removed, and, as shown in FIG. 7D, the pattern forming layer 712 is developed to remove the unexposed area 712a. When an increase in film thickness is contemplated, it is also possible to use a method wherein a series of steps of laminating the film with a pattern forming layer provided thereon, exposing the pattern forming layer, and separating and removing the film are repeated followed by development at a time. Finally, the whole substrate is fired to adhere the pattern forming layer in its exposed area 712b to the glass substrate as shown in FIG. 7E, thereby creating a predetermined thickened film pattern 714.

When the pattern forming layer 712 is non-tacky due to the nature of the material for the photosensitive paste, the film 711 may be separated and removed followed by exposure. In this case, it is also possible to use a method wherein a series of steps of laminating the film with a pattern forming layer provided thereon, separating and removing the film, and exposing the pattern forming layer are repeated followed by development at a time. Further, the laminate shown in FIG. 7A may be stored with a protective film provided on the pattern forming layer 712, and, before the step shown in FIG. 7B, the protective film may be removed and laminated onto the glass substrate 713. The protective film is provided in order to prevent damage to the surface, inclusion of contaminants, blocking and other unfavorable phenomena. Preferably, the protective layer has a thickness of preferably 1 to 400 μm, more preferably 4.5 to 200 μm, and is constituted, for example, by a polyethylene terephthalate film, a 1,4-polycyclohexylene dimethylene terephthalate film, a polyethylene naphthalate film, a polyphenylene sulfide film, a polystyrene film, a polypropylene film, a polysulfone film, an aramid film, a polycarbonate film, a polyvinyl alcohol film, a film of a cellulose derivative, such as cellophane or cellulose acetate, a polyethylene film, a polyvinyl chloride film, a nylon film, a polyimide film, an ionomer film or the like, the protective film in its side to be laminated onto the pattern forming layer having been treated with silicone, acrylmelamine, wax or the like for rendering the protective film releasable.

[C] Composite electrode having two layer structure

The conventional electrode (display electrode) provided on the front plate of PDP is a transparent electrode made of indium tin oxide (ITO). This transparent electrode has higher electric resistance than an electrode made of a metallic conductive material and, in particular, when used in a high-definition plasma display panel or a large-area plasma display panel, exhibits remarkably increased electric resistance, deteriorating the display quality or requiring the application of high voltage.

In order to solve this problem, the formation of a silver paste layer on the transparent electrode is considered effective for reducing the resistance of the display electrode. This method, however, is disadvantageous in that the display contrast is lowered because the silver paste is whitish. For this reason, a black conductive layer should be provided on the transparent electrode to reduce the resistance of the display electrode, and, in addition, the contrast and color purity in the case of viewing of the display panel from the front plate side should be enhanced. At the present time, however, no black conductive layer having a blackness high enough to maintain a high display quality and, at the same time, low electric resistance has hitherto been proposed in the art, posing a problem that either the adverse effect on the display quality or the increase in electric resistance is unavoidable.

Under the above circumstances, the present invention aims to provide a process for producing an electrode which can offer high display quality even in a high-definition or large-area plasma display panel.

The process for producing an electrode of a plasma display panel according to the first invention comprises the steps of: coating a photosensitive black conductive paste containing a black pigment on an insulating substrate and drying the coating to form a photosensitive black conductive paste coating; coating a photosensitive conductive paste on the photosensitive black conductive paste coating and drying the coating to form a photosensitive conductive paste coating; exposing the photosensitive black conductive paste coating and the photosensitive conductive paste coating through a mask having a predetermined pattern; developing the exposed coatings; and then firing the developed coatings to form an electrode having a two layer structure of a black conductive layer and a main conductive layer.

The process for producing an electrode of a plasma display panel according to the second invention comprises the steps of: coating a photosensitive black conductive paste containing a black pigment on an insulating substrate and drying the coating to form a photosensitive black conductive paste coating; exposing the photosensitive black conductive paste coating through a mask having a predetermined pattern; coating a photosensitive conductive paste on the photosensitive black conductive paste coating and drying the photosensitive conductive paste coating; performing exposure through a mask having a predetermined pattern; and developing and firing the photosensitive black conductive paste coating and the photosensitive conductive paste coating to form an electrode having a two layer structure of a black conductive layer and a main conductive layer.

The process for producing an electrode of a plasma display panel according to the third invention comprises the steps of: coating a photosensitive black conductive paste containing a black pigment on an insulating substrate and drying the coating to form a photosensitive black conductive paste coating; exposing the photosensitive black conductive paste coating through a mask having a predetermined pattern and developing the exposed photosensitive black conductive paste coating to form a black conductive layer; coating a photosensitive conductive paste so as to cover the black conductive layer and drying the resultant photosensitive conductive paste coating; and exposing the photosensitive conductive paste coating through a mask having a predetermined pattern and developing the exposed photosensitive conductive paste coating to form a main conductive layer on the black conductive layer, thereby preparing an electrode having a two layer structure.

According to the above present invention, in the electrode having a two layer structure of a black conductive layer and a main conductive layer each formed of a photosensitive paste, the main conductive layer functions to lower the electric resistance of the transparent electrode, while the black conductive layer functions to improve the connection of the main conductive layer to the transparent electrode and, at the same time, to enhance the contrast and color purity of the display panel.

According to the present invention, when the substrate is a glass substrate, an address electrode for PDP may be formed. On the other hand, when the substrate has thereon a patterned transparent conductive film, a composite electrode (a bus electrode) for PDP may be formed.

The best mode for carrying out the invention will be described. The formation of a bus electrode on a transparent electrode of a front panel in an AC type PDP will be described by way of example.

Figure 8A:
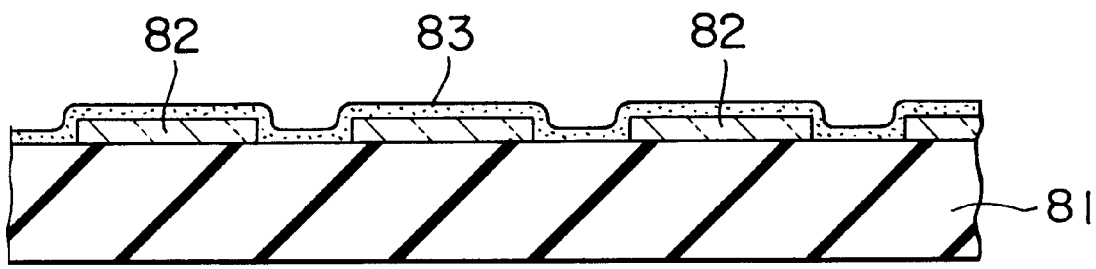
FIGS. 8A to 8C are a process diagram showing one embodiment of the process for producing an electrode of a plasma display panel according to the present invention.

FIG. 8 is process diagram showing one embodiment of the process for producing an electrode of a plasma display panel according to the first invention. In FIG. 8, a photosensitive black conductive paste containing a black pigment is coated so as to cover a transparent electrode 82 provided on an insulating substrate 81, and the coating is dried to a photosensitive black conductive paste coating 83 (FIG. 8A). The photosensitive black conductive paste coating 83 may be formed by screen printing, blade coating, roll coating, die coating, film transfer (which will be described later) or other method(s), and the thickness of the photosensitive black conductive paste coating 83 is preferably about 1 to 15 μm. The transparent electrode 82 may be made of a conventional transparent conductive material, such as indium tin oxide (ITO) or tin oxide ($SnO_2$).

Figure 8B:
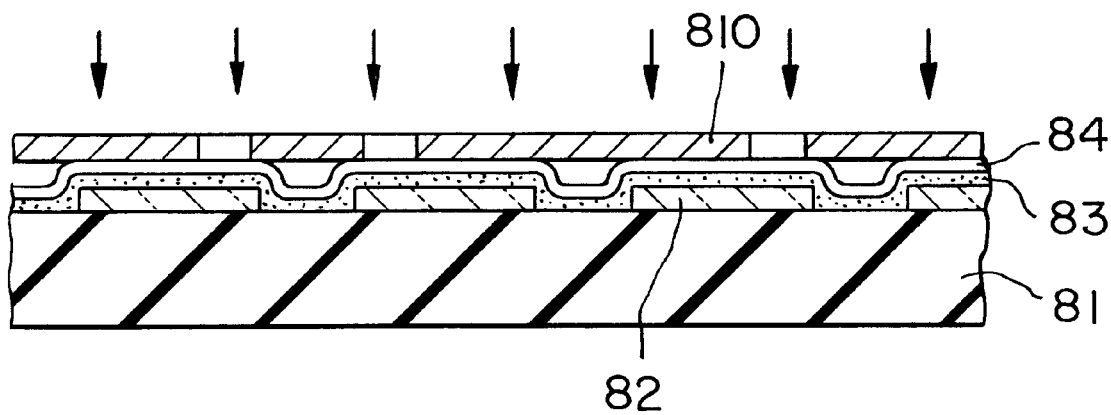

A photosensitive conductive paste is then coated on the photosensitive black conductive paste coating 83, the coating is dried to form a photosensitive conductive paste coating 84, and the photosensitive black conductive paste coating 83 and the photosensitive conductive paste coating 84 are exposed at a time through a mask 810 having a predetermined pattern (FIG. 8B). The photosensitive conductive paste coating 84 may be formed by screen printing, blade coating, roll coating, die coating, film transfer or other method(s), and the thickness of the photosensitive conductive paste coating 84 is preferably about 1 to 20 μm. In this exposure, light, which has been passed through the mask 810 and applied to the photosensitive conductive paste coating 84, exposes the photosensitive conductive paste coating 84 and, at the same time, is transmitted through the photosensitive conductive paste coating 84 and exposes the photosensitive black conductive paste coating 83. The above exposure may be performed using a light source, such as a high-pressure mercury lamp, a low-pressure mercury lamp, a medium-pressure mercury lamp, an ultrahigh-pressure mercury lamp, a xenon lamp, a mercury short arc lamp, a metal halide lamp, an X-radiation, or an electron beam.

Figure 8C:
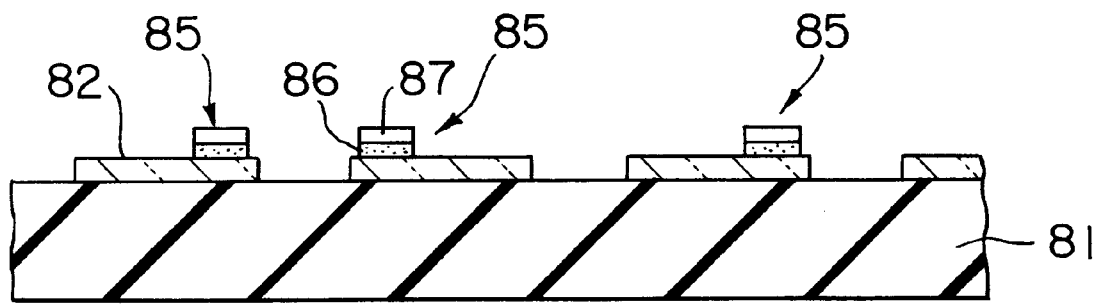

Subsequently, the photosensitive black conductive paste coating 83 and the photosensitive conductive paste coating 84 are developed at a time and then fired to remove the resin component of the photosensitive paste to form an electrode 85 having a two layer structure of a black conductive layer 86 and a main conductive layer 87 on the transparent electrode 82 (FIG. 8C).

The photosensitive black conductive paste used in the formation of an electrode for a plasma display panel comprises a photosensitive conductive paste and a black pigment incorporated thereinto. Black pigments usable herein include conductive black pigments, such as carbon black and titanium black, Co—Cr—Fe, Co—Mn—Fe, Co—Fe—Mn—Al, Co—Ni—Cr—Fe, Co—Ni—Mn—Cr—Fe, Co—Ni—Al—Cr—Fe, and Co—Mn—Al—Cr—Fe—Si. The black pigment has an average particle diameter of about 0.01 to 5 μm and may be incorporated in an amount of 0.1 to 50 parts by weight based on 100 parts by weight of the conductive powder contained in the photosensitive conductive paste. When the average particle diameter of the black pigment is less than 0.01 μm, the production of such fine particles is difficult and, in addition, the thixotropy of the photosensitive black conductive paste is unfavorably large. On the other hand, when the average particle diameter exceeds 5 μm, uneven color is likely to occur. When the content of the black pigment is less than 0.1 part by weight, the coloring is unsatisfactory. On the other hand, a black pigment content exceeding 50 parts by weight unfavorably results in increased resistance and, at the same time, remarkably lowered light transmission to cause unsatisfactory curing in exposed areas of the photosensitive black conductive paste coating 83.

The photosensitive conductive paste used in the formation of the photosensitive black conductive paste and the photosensitive conductive paste used in the formation of the photosensitive conductive paste coating 84 comprise at least a conductive powder and a photosensitive resin component and, if necessary, an inorganic powder for improving the adhesion to the substrate or other purposes.

The conductive powder may be at least one member selected from Au, Ag, Cu, Ni, Al, Ag—Pd and other powders. The form of particles constituting the conductive powder may be any one such as a spherical, flaky, mass, conical, or rod form. Among them, a spherical conductive powder is preferred from the viewpoints of freedom from agglomeration and having good dispersibility, and the average particle diameter is preferably 0.05 to 10 μm. When the average particle diameter of the conductive powder is less than 0.05 μm, the structural viscosity (thixotropy) of the photosensitive conductive paste is unfavorably large. On the other hand, when the average particle diameter of the conductive powder exceeds 10 μm, the permeability of the photosensitive conductive paste coating 84 to light is unsatisfactory, adversely affecting the exposure of the photosensitive black conductive paste coating 83. Preferably, the conductive powder has a specific surface area of 0.1 to 3 m$^2$/g from the viewpoint of pattern edge accuracy. The above conductive powder may be incorporated in an amount of 45 to 93% by weight into the photosensitive conductive paste.

Inorganic powders which may be optionally added to the photosensitive conductive paste include, for example, a glass frit having a softening temperature of 400 to 650° C. and a coefficient of thermal expansion $\alpha_{300}$ of 60×10$^{-7}$ to 100×10$^{-7}$/° C. When the softening temperature of the glass frit exceeds 650° C., the firing temperature should be increased. In this case, for example, when the heat resistance of the insulting substrate is low, thermal deformation is unfavorably created in the insulating substrate at the stage of firing. On the other hand, when the softening temperature of the glass frit is below 400° C., the glass frit is fused before complete decomposition and volatilization of the resin component in the photosensitive black conductive paste and the photosensitive conductive paste, unfavorably creating voids. When the coefficient of thermal expansion $\alpha_{300}$ is less than 60×10$^{-7}$/° C. or exceeds 100×10$^{-7}$/° C., the difference in coefficient of thermal expansion between the glass frit and the glass substrate is excessively large, creating deformation or the like. The average particle diameter of the glass frit is preferably 0.1 to 5 μm.

The photosensitive resin component constituting the photosensitive conductive paste comprises at least an alkali-developable binder polymer and a monomer and, if necessary, an initiator and a solvent. Upon firing, it is volatilized and decomposed and does not leave any carbide in the pattern. Materials described in the above item [B] may be used for the photosensitive resin component.

FIG. 9 is a process diagram showing one embodiment of the process for producing an electrode of a plasma display panel according to the second invention. In FIG. 9, a photosensitive black conductive paste containing a black pigment is coated so as to cover a transparent electrode 82 provided on an insulating substrate 81, and the coating is dried to form a photosensitive black conductive paste coating 83, the photosensitive black conductive paste coating 83 is exposed through a mask 811 having a predetermined pattern (FIG. 9A). The photosensitive black conductive paste, the process for producing the photosensitive black conductive paste coating 83, and the thickness of the photosensitive black conductive paste coating 83 used herein are the same as those in the process for producing an electrode according to the first invention. Light sources usable herein are the same as those described above in connection with the process for producing an electrode according to the first invention.

A photosensitive conductive paste is then coated on the exposed photosensitive black conductive paste coating 83, and the coating is then dried to form a photosensitive conductive paste coating 84, and the photosensitive conductive paste coating 84 is exposed through a mask 812 having a predetermined pattern (FIG. 9B). The photosensitive conductive paste, the process for producing the photosensitive conductive paste coating 84, and the thickness of the photosensitive conductive paste coating 84 used herein are the same as those in the process for producing an electrode according to the first invention. In this exposure, light, which has been passed through the mask 812 and applied to the photosensitive conductive paste coating 84 exposes the photosensitive conductive paste coating 84 and, at the same time, is transmitted through the photosensitive conductive paste coating 84 and applied also to the photosensitive black conductive paste 83. As shown in the drawing, however, the mask 812 has an opening which overlaps with the opening of the mask 811, avoiding unnecessary exposure of the photosensitive black conductive paste coating 83. Light sources usable herein are the same as those described above in connection with the process for producing an electrode according to the first invention.

Subsequently, the photosensitive black conductive paste coating 83 and the photosensitive conductive paste coating 84 are developed at a time and then fired to remove the resin component in photosensitive paste, thereby forming an electrode 85 having a two layer structure of a black conductive layer 86 and a main conductive layer 87 on the transparent electrode 82 (FIG. 9C).

FIG. 10 is a process diagram showing one embodiment of the process for producing an electrode of a plasma display panel according to the third invention. In FIG. 10, a photosensitive black conductive paste containing a black pigment is coated so as to cover a transparent electrode 82 provided on an insulating substrate 81, and the coating is dried to form a photosensitive black conductive paste coating 83, the photosensitive black conductive paste coating 83 is exposed through a mask 811 having a predetermined pattern (FIG. 10A). The photosensitive black conductive paste, the process for producing the photosensitive black conductive paste coating 83, and the thickness of the photosensitive black conductive paste coating 83 used herein are the same as those in the process for producing an electrode according to the first invention. Light sources usable herein are the same as those described above in connection with the process for producing an electrode according to the first invention.

Figure 10A:
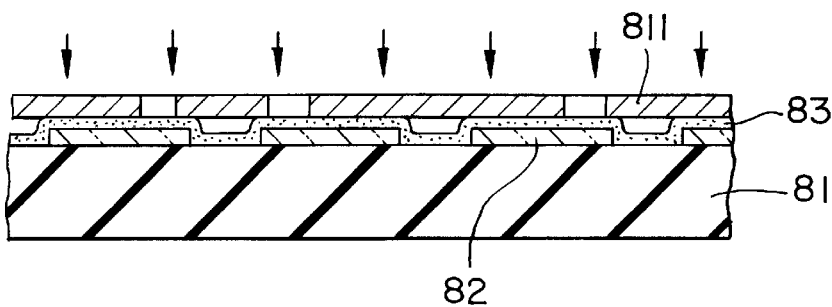
FIGS. 10A to 10D are a process diagram showing a further embodiment of the process for producing a plasma display panel according to the present invention.
Figure 10B:
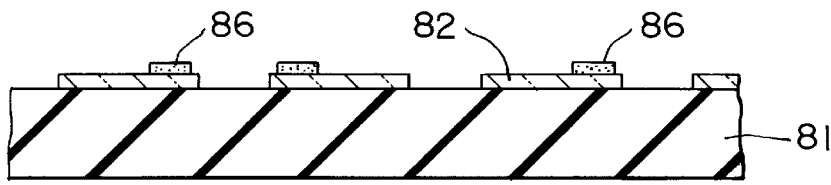
Figure 10C:
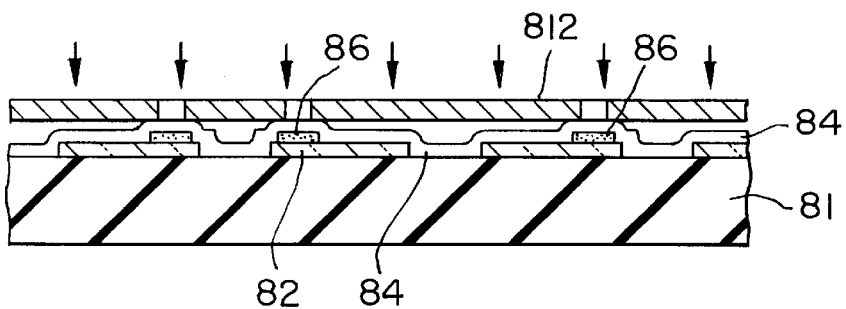
Figure 10D:
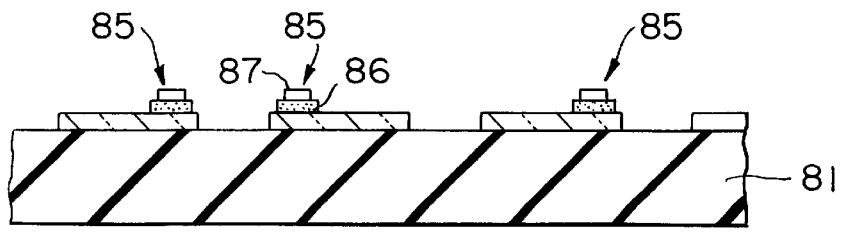

The exposed photosensitive black conductive paste coating 83 is developed to form a pattern of a black conductive layer 86 (FIG. 10B). Thereafter, a photosensitive conductive paste is coated so as to cover the pattern, and the coating is then dried to form a photosensitive conductive paste coating 84, and the photosensitive conductive paste coating 84 is exposed through a mask 812 having a predetermined pattern (FIG. 10C). The photosensitive conductive paste, the process for producing the photosensitive conductive paste coating 84, and the thickness of the photosensitive conductive paste coating 84 are the same as those described above in connection with the process for producing an electrode according to the first invention. Light sources usable herein are the same as those described above in connection with the process for producing an electrode according to the first invention.

Figure 3A:
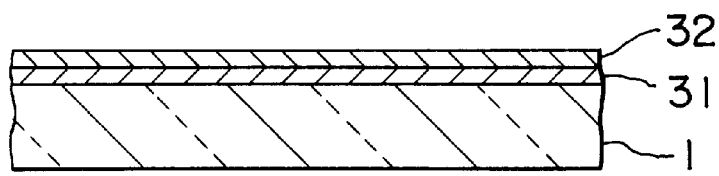
FIGS. 3A to 3F are a process diagram showing a second embodiment for forming a composite electrode on a front plate.
Figure 3B:
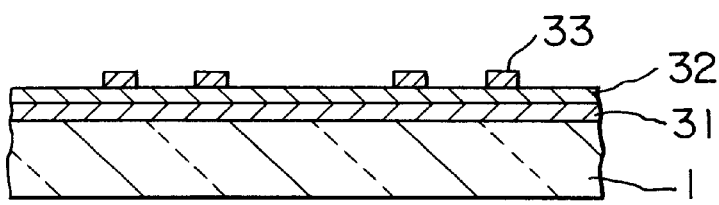
Figure 3C:
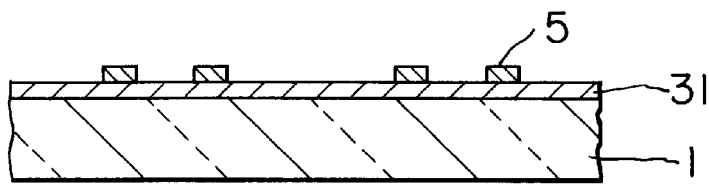
Figure 3D:
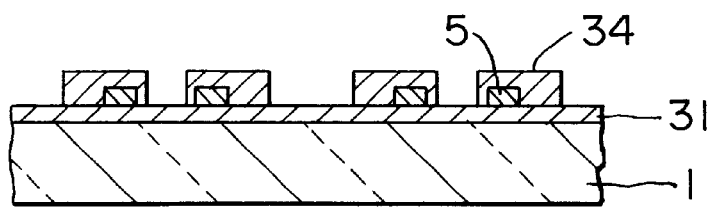

Subsequently, the photosensitive conductive paste coating 84 is developed to form a pattern of a main conductive layer 87 and then fired to remove the resin component from the pattern of the black conductive layer 86 and the pattern of the main conductive layer 87 to form an electrode 85 having a two layer structure of a black conductive layer 86 and a main conductive layer 87 on the transparent electrode 82 (FIG. 3D).

[D] Production of composite electrode having two layer structure by transfer

In this aspect of the present invention, there is provided a transfer sheet and a process for producing an electrode which can produce an electrode having high display quality even in a high-definition or large-area plasma display panel.

The transfer sheet for an electrode of a plasma display panel according to the first invention comprises: a transfer support; a photosensitive conductive paste layer separably provided on the transfer support; and a photosensitive black conductive paste layer, containing a black pigment, provided on the photosensitive conductive paste layer.

The transfer sheet for an electrode of a plasma display panel according to the second invention is such that the transfer support is permeable to light.

The transfer sheet for an electrode of a plasma display panel according to the third invention comprises: a transfer support; and a photosensitive black conductive paste layer, containing a black pigment, separably provided on the transfer support.

The transfer sheet for an electrode of a plasma display panel according to the fourth invention is such that the transfer support is permeable to light.

The transfer sheet for an electrode of a plasma display panel according to the fifth invention comprises: a transfer support; and a photosensitive conductive paste layer separably provided on the transfer support.

The transfer sheet for an electrode of a plasma display panel according to the sixth invention is such that the transfer support is permeable to light.

The process for producing an electrode of a plasma display panel according to the first invention comprise the steps of: transferring a photosensitive black conductive paste layer and a photosensitive conductive paste layer onto an insulating substrate using the transfer sheet for an electrode according to the first or second invention; exposing the photosensitive black conductive paste layer and the photosensitive conductive paste layer through a mask having a predetermined pattern; developing the exposed photosensitive black conductive paste layer and the exposed photosensitive conductive paste layer; and performing firing to form an electrode having a two layer structure of a black conductive layer and a main conductive layer.

The process for producing an electrode of a plasma display panel according to the second invention comprises the steps of: bringing the photosensitive black conductive paste layer side of the transfer sheet for an electrode according to the second invention into contact with the surface of an insulating substrate by pressure; exposing the photosensitive black conductive paste layer and the photosensitive conductive paste layer from above the transfer support through a mask having a predetermined pattern; separating and removing the transfer support; and performing development and firing to form an electrode having a two layer structure of a black conductive layer and a main conductive layer.

The process for producing an electrode of a plasma display panel according to the third invention comprises the steps of: exposing the photosensitive black conductive paste layer and the photosensitive conductive paste layer of the transfer sheet for an electrode according to the first or second invention through a mask having a predetermined pattern; transferring the photosensitive black conductive paste layer and the photosensitive conductive paste layer of the transfer sheet onto an insulating substrate; and developing and firing the transferred photosensitive black conductive paste layer and photosensitive conductive paste layer to form an electrode having a two layer structure of a black conductive layer and a main conductive layer.

The process for producing an electrode of a plasma display panel according to the fourth invention comprises the steps of: exposing the photosensitive black conductive paste layer and the photosensitive conductive paste layer of the transfer sheet for an electrode according to the first or second invention through a mask having a predetermined pattern; developing the exposed photosensitive black conductive paste layer and the exposed photosensitive conductive paste layer to form a black conductive layer pattern and a main conductive layer pattern; transferring the black conductive layer pattern and the main conductive layer pattern in the transfer sheet onto an insulting substrate; and then performing firing to form an electrode having a two layer structure of a black conductive layer and a main conductive layer.

The process for producing an electrode of a plasma display panel according to the fifth invention comprises the steps of: transferring a photosensitive black conductive paste layer onto a transparent electrode, provided on an insulting substrate, using the transfer sheet for an electrode according to the third or fourth invention; transferring a photosensitive conductive paste layer onto the photosensitive black conductive paste layer using the transfer sheet for an electrode according to the fifth or sixth invention; exposing the transferred photosensitive black conductive paste layer and photosensitive conductive paste layer through a mask having a predetermined pattern; developing the exposed photosensitive black conductive paste layer and photosensitive conductive paste layer; and performing firing to form an electrode having a two layer structure of a black conductive layer and a main conductive layer.

The process for producing an electrode of a plasma display panel according to the sixth invention comprises the steps of: transferring a photosensitive black conductive paste layer onto an insulting substrate using the transfer sheet for an electrode according to the third or fourth invention; bringing the photosensitive conductive paste layer side of the transfer sheet for an electrode according to the sixth invention into contact with the top surface of the photosensitive black conductive paste layer by pressure; exposing the photosensitive black conductive paste layer and the photosensitive conductive paste layer from above the transfer support through a mask having a predetermined pattern; separating and removing the transfer support; and performing development and then firing to form an electrode having a two layer structure of a black conductive layer and a main conductive layer.

The process for producing an electrode of a plasma display panel according to the seventh invention comprises the steps of: transferring a photosensitive black conductive paste layer onto an insulting substrate using the transfer sheet for an electrode according to the third or fourth invention; exposing the transferred photosensitive black conductive paste layer through a mask having a predetermined pattern; transferring a photosensitive conductive paste layer onto the photosensitive black conductive paste layer using the transfer sheet for an electrode according to the fifth or sixth invention; exposing the photosensitive conductive paste layer through a mask having a predetermined pattern; and performing development and then firing to form an electrode having a two layer structure of a black conductive layer and a main conductive layer.

The process for producing an electrode of a plasma display panel according to the eighth invention comprises the steps of: bringing the photosensitive black conductive paste layer side of the transfer sheet for an electrode according to the fourth invention into contact with the surface of an insulating substrate by pressure; exposing the photosensitive black conductive paste layer from the top of the transfer support through a mask having a predetermined pattern; separating and removing the transfer support; bringing the photosensitive conductive paste layer side of the transfer sheet for an electrode according to the sixth invention into contact with the photosensitive black conductive paste layer by pressure; exposing the photosensitive conductive paste layer from above the transfer support through a mask having a predetermined pattern; separating and removing the transfer support; and performing development and then firing to form an electrode having a two layer structure of a black conductive layer and a main conductive layer.

The process for producing an electrode of a plasma display panel according to the ninth invention comprises the steps of: transferring a photosensitive black conductive paste layer onto an insulting substrate using the transfer sheet for an electrode according to the third or fourth invention; exposing the transferred photosensitive black conductive paste layer through a mask having a predetermined pattern; developing the exposed photosensitive black conductive paste layer to form a black conductive layer pattern; transferring a photosensitive conductive paste layer using the transfer sheet for an electrode according to the fifth or sixth invention so as to cover the black conductive layer; exposing the photosensitive conductive paste layer through a mask having a predetermined pattern; developing the exposed photosensitive conductive paste layer to form a main conductive layer pattern; and then performing firing to form an electrode having a two layer structure of a black conductive layer and a main conductive layer.

The process for producing an electrode of a plasma display panel according to the tenth invention comprises the steps of: bringing the photosensitive black conductive paste layer side of the transfer sheet for an electrode according to the fourth invention into contact with the surface of an insulating substrate by pressure; exposing the photosensitive black conductive paste layer from above the transfer support through a mask having a predetermined pattern; separating and removing the transfer support; developing the photosensitive black conductive paste layer to form a black conductive layer pattern; bringing the photosensitive conductive paste layer side of the transfer sheet for an electrode according to the sixth invention into contact with the black conductive layer pattern by pressure so as to cover the black conductive layer; exposing the photosensitive conductive paste layer from above the transfer support through a mask having a predetermined pattern; separating and removing the transfer support; developing the photosensitive conductive paste layer to form a main conductive layer pattern; and performing firing to form an electrode having a two layer structure of a black conductive layer and a main conductive layer.

The process for producing an electrode of a plasma display panel according to the eleventh invention comprises the steps of: exposing the photosensitive black conductive paste layer in the transfer sheet for an electrode according to the third or fourth invention through a mask having a predetermined pattern; transferring the photosensitive black conductive paste layer in the transfer sheet onto an insulating substrate; exposing the photosensitive conductive paste layer in the transfer sheet for an electrode according to the fifth or sixth invention through a mask having a predetermined pattern; transferring the photosensitive conductive paste layer onto the photosensitive black conductive paste layer; and performing development and firing to form an electrode having a two layer structure of a black conductive layer and a main conductive layer.

The process for producing an electrode of a plasma display panel according to the twelfth invention comprises the steps of: exposing the photosensitive black conductive paste layer in the transfer sheet for an electrode according to the third or fourth invention through a mask having a predetermined pattern; developing the exposed photosensitive black conductive paste layer to form a black conductive layer pattern; transferring the black conductive layer pattern provided on the transfer support onto an insulating substrate; exposing the photosensitive conductive paste layer in the transfer sheet for an electrode according to the fifth or sixth invention through a mask having a predetermined pattern; developing the exposed photosensitive conductive paste layer to form a main conductive layer pattern; transferring the main conductive layer pattern in the transfer sheet onto the black conductive layer pattern; and performing firing to form an electrode having a two layer structure of a black conductive layer and a main conductive layer.

According to the above present invention, in the electrode having a two layer structure of a black conductive layer and a main conductive layer, provided on an insulating substrate by transfer, using a photosensitive paste layer provided on a transfer support, the main conductive layer functions to lower the electric resistance of the transparent electrode, while the black conductive layer functions to improve the connection of the main conductive layer to the transparent electrode and, at the (same time, to enhance the contrast and color purity of the display panel.

According to the present invention, when the substrate is a glass substrate, an address electrode for PDP may be formed. On the other hand, when the substrate is a substrate with a patterned transparent conductive film, a composite electrode (a bus electrode) for PDP may be formed.

The best mode for carrying out the invention will be described.

Transfer sheet according to the first invention

Figure 11:
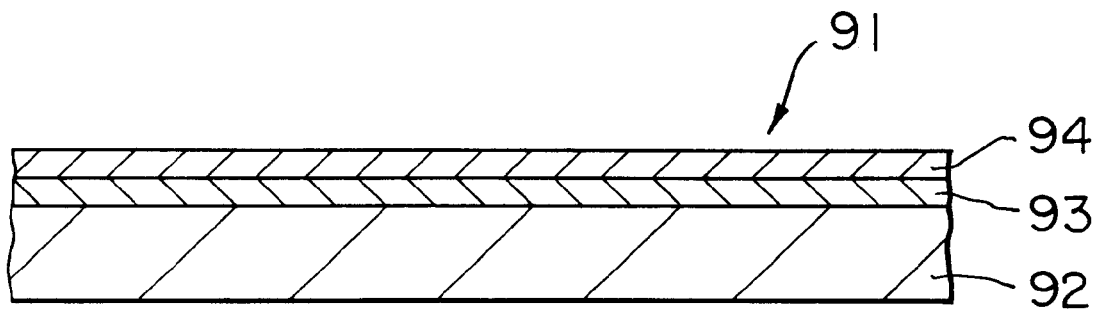
FIGS. 11 to 13 are schematic cross-sectional views showing an embodiment of the transfer sheet for an electrode of a plasma display panel according to the present invention.

FIG. 11 is a schematic cross-sectional view showing one embodiment of the transfer sheet for an electrode of a plasma display panel according to the first invention. In FIG. 11, a transfer sheet 91 has a structure comprising a photosensitive conductive paste layer 93 and a photosensitive black conductive paste layer 94 laminated in that order onto a transfer support 92. The photosensitive conductive paste layer 93 is separably provided on the transfer support 92. A protective film (not shown) formed of the same material as described above may be provided on the photosensitive black conductive paste layer 94 in order to prevent damage, inclusion of contaminants, blocking and other unfavorable phenomena.

Examples of the transfer support 92 constituting the transfer sheet 91 include resin films, such as films of polyethylene terephthalate, polyethylene naphthalate, polyphenylene sulfide, polystyrene, polypropylene, polyethylene, polysulfone, polyamide, polycarbonate, polyvinyl alcohol, polyimide, cellulose derivatives, such as cellophane and triacetyl cellulose, and ionomers; thin sheets of metals, such as SUS, Al, and Cu; and composites of the above materials. The thickness of the transfer support 92 may be 1 to 400 $\mu$m, preferably 4.5 to 200 $\mu$m. The transfer sheet may be in sheet, continuous, or any other form. Further, a primer layer for regulating the adhesion and releasability between the transfer support 92 and the photosensitive conductive paste layer 93 may be provided on the transfer support 92 in its surface on which the photosensitive conductive paste layer 93 is to be formed. The primer layer may be formed of a vinyl chloride/vinyl acetate copolymer, a (meth)acrylate resin, an isocyanate curing resin, an epoxy resin, a silicone resin (oil), a fluororesin, a polyethylene wax, a carnauba wax, an acrylmelamine resin or the like. The thickness of the primer layer may be about 0.1 to 10 $\mu$m.

The photosensitive conductive paste layer 93 constituting the transfer sheet 91 comprises at least a conductive powder and a photosensitive resin component and may be formed by coating, on the transfer support 92, a photosensitive conductive paste optionally containing an inorganic powder for improving the adhesion to a substrate, on which an electrode is to be formed, or other purposes and drying the coating. The photosensitive conductive paste may be coated by blade coating, roll coating, bead coating, gravure coating, dip coating, Komma coating, die coating or the like.

The conductive powder may be at least one member selected from Au, Ag, Cu, Ni, Al, Ag—Pd and other powders. The form of particles constituting the conductive powder may be any one such as a spherical, flaky, mass, conical, or rod form. Among them, a spherical conductive powder is preferred from the viewpoints of good light transmission, freedom from agglomeration and having good dispersibility, and the average particle diameter is preferably 0.05 to 10 $\mu$m. When the average particle diameter of the conductive powder is less than 0.05 $\mu$m, the structural viscosity (thixotropy) of the photosensitive conductive paste is unfavorably large. On the other hand, when the average particle diameter of the conductive powder exceeds 10 $\mu$m, the permeability of the photosensitive conductive paste layer 93 to light applied in the process for producing an electrode according to the present invention which will be described later, adversely affecting the exposure of the photosensitive black conductive paste layer 94. The above conductive powder may be incorporated in an amount of 45 to 93% by weight into the photosensitive conductive paste layer 93.

Inorganic powders which may be optionally incorporated into the photosensitive conductive paste layer 93 include, for example, a glass frit having a softening temperature of 400 to 650° C. and a coefficient of thermal expansion $\alpha_{300}$ of $60 \times 10^{-7}$ to $100 \times 10^{-7}$/° C. When the softening temperature of the glass frit exceeds 650° C., the firing temperature should be increased. In this case, for example, when the heat resistance of the insulting substrate, on which an electrode is to be formed, is low, thermal deformation is unfavorably created in the insulating substrate at the stage of firing. On the other hand, when the softening temperature of the glass frit is below 400° C., the glass frit is fused before complete decomposition and volatilization of the resin component in the photosensitive conductive paste layer 93, unfavorably creating voids. When the coefficient of thermal expansion $\alpha_{300}$ is less than $60 \times 10^{-7}$/° C. or exceeds $100 \times 10^{-7}$/° C., the difference in coefficient of thermal expansion between the glass frit and the glass substrate, on which an electrode is to be formed, is excessively large, creating deformation or the like. The average particle diameter of the glass frit is preferably 0.1 to 5 $\mu$m.

The photosensitive resin component constituting the photosensitive conductive paste layer 93 comprises at least an alkali-developable binder polymer and a monomer and, if necessary, an initiator and a solvent. These materials may be the same as those described above in connection with the process for producing an electrode pattern. These materials, upon firing, should be volatilized and decomposed and do not leave any carbide in the pattern.

The thickness of the photosensitive conductive paste layer 93 formed of the photosensitive conductive paste may be about 2 to 30 $\mu$m.

The photosensitive black conductive paste layer 94 constituting the transfer sheet 91 may be formed by coating a photosensitive black conductive paste comprising the above photosensitive paste with a black pigment incorporated thereinto on the photosensitive conductive paste layer 93 and drying the coating. Coating methods usable herein include blade coating, roll coating, die coating, bead coating, gravure coating, dip coating, and Komma coating.

Black pigments usable in the photosensitive black conductive paste include conductive black pigments, such as carbon black and titanium black, Co—Cr—Fe, Co—Mn—Fe, Co—Fe—Mn—Al, Co—Ni—Cr—Fe, Co—Ni—Mn—Cr—Fe, Co—Ni—Al—Cr—Fe, and Co—Mn—Al—Cr—Fe—Si. The black pigment has an average particle diameter of about 0.01 to 5 $\mu$m and may be incorporated in an amount of 0.1 to 50 parts by weight based on 100 parts by weight of the conductive powder contained in the photosensitive conductive paste. When the average particle diameter of the black pigment is less than 0.01 $\mu$m, the production of such fine particles is difficult and, in addition, the thixotropy of the photosensitive black conductive paste is excessively large. On the other hand, when the average particle diameter exceeds 5 $\mu$m, uneven color is likely to occur. When the content of the black pigment is less than 0.1 part by weight, the coloring is unsatisfactory. On the other hand, a black pigment content exceeding 50 parts by weight unfavorably results in increased resistance and, at the same time, remarkably lowered light transmission to cause unsatisfactory curing in exposed areas of the photosensitive black conductive paste layer 94.

The thickness of the photosensitive black conductive paste layer 94 formed of the photosensitive black conductive paste may be about 1 to 15 μm.

Transfer sheet of the second invention

The transfer sheet for an electrode of a plasma display panel according to the second invention is the same as the transfer sheet 91 according to the first invention, except that the transfer support 92 is formed of a resin film permeable to light, such as a film of polyethylene terephthalate, polyethylene naphthalate, polyphenylene sulfide, polystyrene, polypropylene, polyethylene, polysulfone, polyamide, polycarbonate, polyvinyl alcohol, polyimide, cellulose derivatives, such as cellophane or triacetyl cellulose, or an ionomer. Imparting light permeability to the transfer support 92 permits the photosensitive conductive paste layer 93 and the photosensitive black conductive paste layer 94 to be exposed through the transfer support 92. As with the transfer sheet according to the first invention, a protective film (not shown) may be provided.

Transfer sheet according to the third invention

Figure 12:
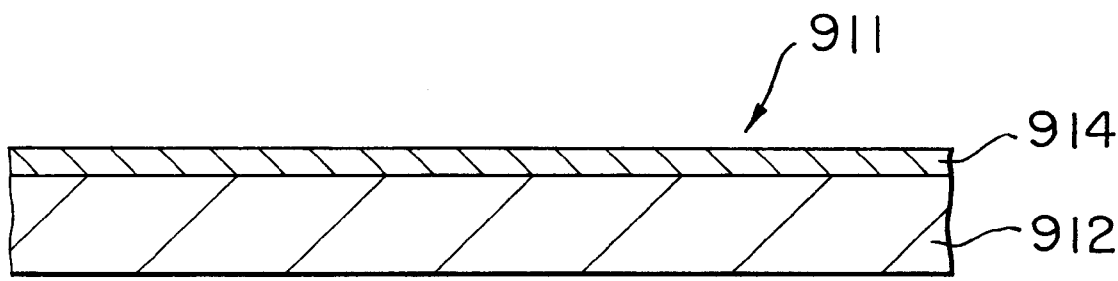

FIG. 12 is a schematic cross-sectional view showing one embodiment of the transfer sheet for an electrode of a plasma display panel according to the third invention. In FIG. 12, a transfer sheet 911 has a structure comprising a photosensitive black conductive paste layer 914 separably provided on a transfer support 912. As with the transfer sheet according to the first invention, a protective film (not shown) may be provided.

The transfer support 912 constituting the transfer sheet 911 may be the same as the transfer support 92 constituting the transfer sheet 91 according to the first invention. In order to regulate the adhesion and releasability between the transfer support 912 and the photosensitive black conductive paste layer 914, a primer layer may be provided on the transfer support 912 in its surface on which the photosensitive black conductive paste layer 914 is to be formed.

As with the photosensitive black conductive paste layer 94 constituting the transfer sheet 91 according to the first invention, the photosensitive black conductive paste layer 914 constituting the transfer sheet 911 may be one formed by coating a photosensitive black conductive paste, comprising a photosensitive conductive paste with a black pigment incorporated thereinto, on a transfer support 912 and drying the coating.

Transfer sheet according to the fourth invention

The transfer sheet for an electrode of a plasma display panel according to the fourth invention is the same as the transfer sheet 911 according to the third invention, except that the transfer support 912 is formed of a resin film permeable to light, such as a film of polyethylene terephthalate, polyethylene naphthalate, polyphenylene sulfide, polystyrene, polypropylene, polyethylene, polysulfone, polyamide, polycarbonate, polyvinyl alcohol, polyimide, cellulose derivatives, such as cellophane or triacetyl cellulose, or an ionomer. Imparting light permeability to the transfer support 912 permits the photosensitive black conductive paste layer 914 to be exposed through the transfer support 912. As with the transfer sheet according to the first invention, a protective film (not shown) may be provided.

Transfer sheet according to the fifth invention

Figure 13:
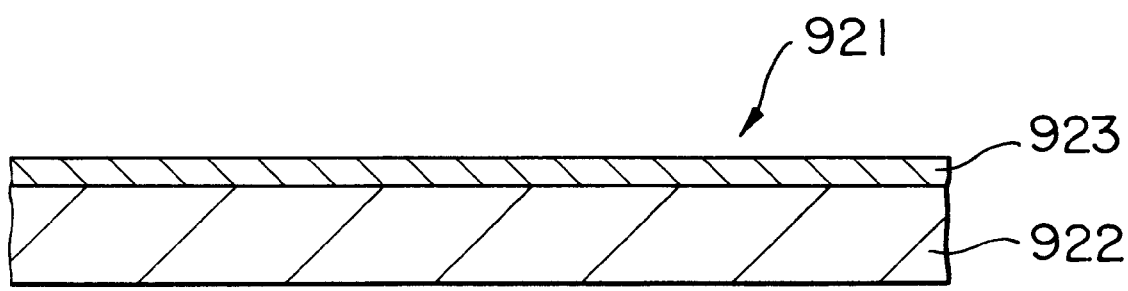

FIG. 13 is a schematic cross-sectional view showing one embodiment of the transfer sheet for an electrode of a plasma display panel according to the fifth invention. In FIG. 13, a transfer sheet 921 has a structure comprising a photosensitive conductive paste layer 923 separably provided on a transfer support 922. As with the transfer sheet according to the first invention, a protective film (not shown) may be provided.

The transfer support 922 constituting the transfer sheet 921 may be the same as the transfer support 92 constituting the transfer sheet 91 according to the first invention. In order to regulate the adhesion and releasability between the transfer support 922 and the photosensitive conductive paste layer 923, a primer layer may be provided on the transfer support 922 in its surface on which the photosensitive conductive paste layer 923 is to be formed.

As with the transfer support 93 constituting the transfer sheet 91 according to the first invention, the photosensitive conductive paste layer 923 constituting the transfer sheet 921 may be one formed by coating a photosensitive conductive paste on a transfer support 922 and drying the coating.

Transfer sheet according to the sixth invention

The transfer sheet for an electrode of a plasma display panel according to the sixth invention is the same as the transfer sheet 921 according to the fifth invention, except that the transfer support 922 is formed of a resin film permeable to light, such as a film of polyethylene terephthalate, polyethylene naphthalate, polyphenylene sulfide, polystyrene, polypropylene, polyethylene, polysulfone, polyamide, polycarbonate, polyvinyl alcohol, polyimide, cellulose derivatives, such as cellophane or triacetyl cellulose, or an ionomer. Imparting light permeability to the transfer support 922 permits the photosensitive conductive paste layer 923 to be exposed through the transfer support 922. As with the transfer sheet according to the first invention, a protective film (not shown) may be provided.

The process for producing an electrode according to the present invention will be described.

Here the formation of a bus electrode on a transparent electrode provided on a front plate of an AC type PDP will be described by way of example. However, it should be noted that the bus electrode may be formed directly on an insulating substrate.

Process for producing an electrode according to the first invention

Figure 14A:
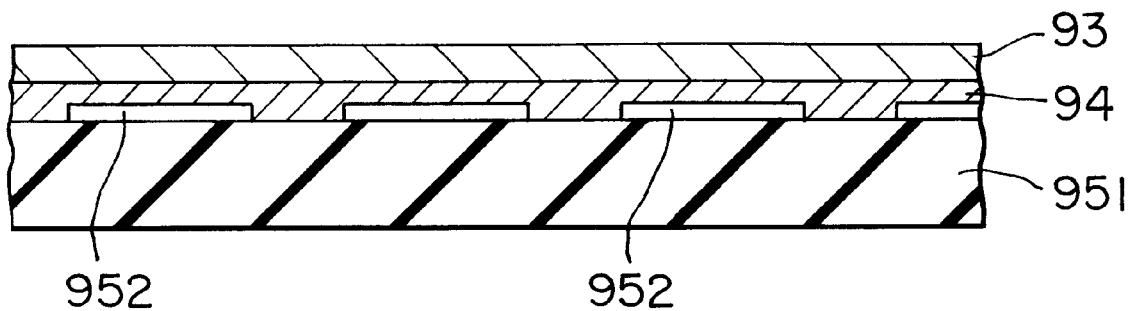
FIGS. 14A to 14C.

FIG. 14 is a process diagram showing one embodiment of the process for producing an electrode of a plasma display panel according to the first invention. In FIG. 14, at the outset, a photosensitive conductive paste layer 93 and a photosensitive black conductive paste layer 94 are transferred using the transfer sheet 91 for an electrode according to the first or second invention so as to cover a transparent electrode 952 provided on an insulating substrate 951 (FIG. 14A). The formation of the photosensitive conductive paste layer 93 and the photosensitive black conductive paste layer 94 by transfer may be performed by bringing the transfer sheet 91 into contact with the transparent electrode 952 provided on the insulating substrate 951 by pressure or by pressure under heating and separating and removing the transfer support 92. The transparent electrode 952 may be formed of a conventional transparent conductive material, such as indium tin oxide (ITO) or tin oxide ($SnO_2$).

Figure 14B:
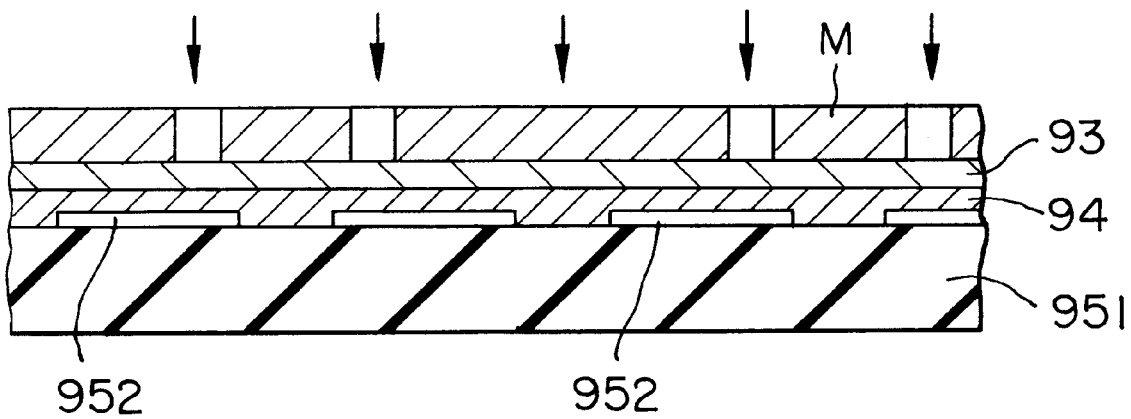

The photosensitive conductive paste layer 93 and the photosensitive black conductive paste layer 94 are exposed through a mask M having a predetermined pattern (FIG. 14B). In this exposure, light, which has been passed through the mask M and applied to the photosensitive conductive paste layer 93, exposes the photosensitive conductive paste layer 93 and, at the same time, is transmitted through the photosensitive conductive paste layer 93 and exposes the photosensitive black conductive paste layer 94. The above exposure may be performed using a light source, such as a high-pressure mercury lamp, a low-pressure mercury lamp, a medium-pressure mercury lamp, an ultrahigh-pressure mercury lamp, a xenon lamp, a mercury short arc lamp, a metal halide lamp, an X-radiation, or an electron beam. In the above exposure, when the photosensitive conductive paste layer 93 has no adhesion to the mask M, the exposure may be performed with the mask M in intimate contact with the photosensitive conductive paste layer 93. On the other hand, when the photosensitive conductive paste layer 93 has adhesion to the mask M, it is preferred to provide a space between the mask M and the photosensitive conductive paste layer 93.

Figure 14C:
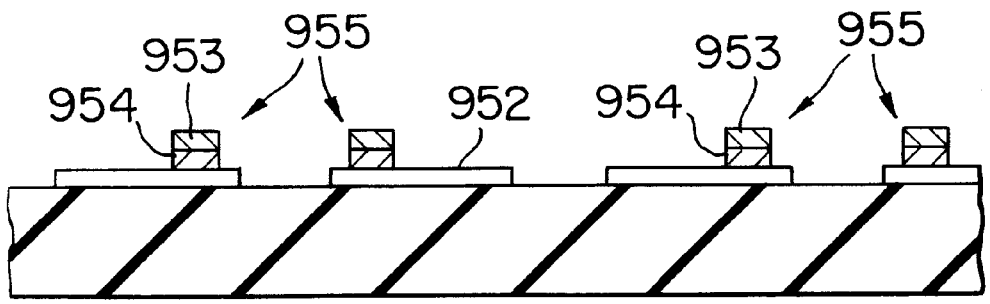

Subsequently, the photosensitive conductive paste layer 93 and the photosensitive black conductive paste layer 94 are developed at a time and then fired to remove the resin component constituting the photosensitive conductive paste layer 93 and the photosensitive black conductive paste layer 94, thereby forming an electrode having a two layer structure of a black conductive layer 954 and a main conductive layer 953 on the transparent electrode 955 (FIG. 14C).

Process for producing an electrode according to the second invention

FIG. 15 is a process diagram showing one embodiment of the process for producing an electrode of a plasma display panel according to the second invention. In FIG. 15, the photosensitive black conductive paste layer 94 side of the transfer sheet 91 for an electrode according to the second invention is brought into contact with an insulating substrate 951 having thereon a transparent electrode 952 by pressure so as to cover the transparent electrode 952, and the photosensitive conductive paste layer 93 and the photosensitive black conductive paste layer 94 are exposed from above the transfer support 92 through a mask M having a predetermined pattern (FIG. 15A). In this exposure, light, which has been passed through the mask M, is transmitted through the transfer support 92 permeable to light to expose the photosensitive conductive paste layer 93 and, at the same time, is transmitted through the photosensitive conductive paste layer 93 to expose the photosensitive black conductive paste layer 94. By virtue of the exposure from above the transfer support 92, the exposure may be performed independently of the adhesion of The photosensitive conductive paste layer 93. Light sources usable herein are the same as those described above in connection with the process for producing an electrode according to the first invention.

Subsequently, the transfer support 92 is separated and removed to transfer the photosensitive conductive paste layer 93 and the photosensitive black conductive paste layer 94, and the photosensitive conductive paste layer 93 and the photosensitive black conductive paste layer 94 are then developed at a time. Thereafter, firing is performed to remove the resin component constituting the photosensitive conductive paste layer 93 and the photosensitive black conductive paste layer 94 to form an electrode 955 having a two layer structure of a black conductive layer 954 and a main conductive layer 953 on the transparent electrode 952 (FIG. 15B).

Process for producing an electrode according to the third invention

Figure 16A:
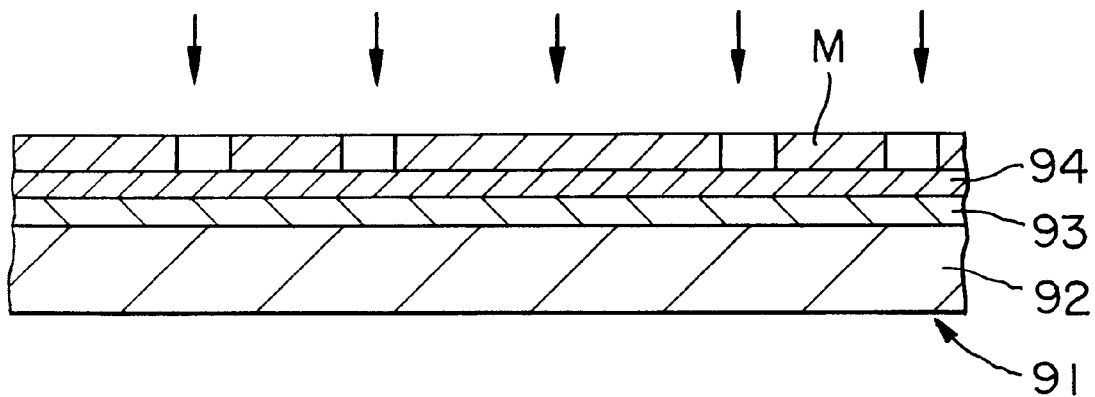
FIGS. 16A to 16C.

FIG. 16 is a process diagram showing one embodiment of the process for producing an electrode of a plasma display panel according to the third invention. In FIG. 16, at the outset, the photosensitive conductive paste layer 93 and the photosensitive black conductive paste layer 94 in the transfer sheet 91 for an electrode according to the first or second invention are exposed through a mask M having a predetermined pattern (FIG. 16A). In this exposure, light, which has been passed through the mask M, exposes the photosensitive black conductive paste layer 94 and, at the same time, is transmitted through the photosensitive black conductive paste layer 94 to expose the photosensitive conductive paste layer 93. Preferred light sources for such exposure include a high-pressure mercury lamp, a low-pressure mercury lamp, a medium-pressure mercury lamp, an ultrahigh-pressure mercury lamp, a xenon lamp, a mercury short arc lamp, a metal halide lamp, an X-radiation, or an electron beam. In the above exposure, when the photosensitive black conductive paste layer 94 has no adhesion to the mask M, exposure may be performed in such a manner that, after the protective film, if any, is separated and removed, exposure is performed with the mask M in intimate contact with the photosensitive black conductive paste layer 94. On the other hand, when the photosensitive conductive paste layer 94 has adhesion to the mask M, exposure may be performed with a space provided between the mask M and the photosensitive black conductive paste layer 94 or alternatively with a protective film permeable to light provided. When the transfer sheet 91 according to the second invention wherein the transfer support 92 is permeable to light is used, exposure may be performed from the transfer support 92 side through the mask M. Light sources usable herein are the same as those described above in connection with the process for producing an electrode according to the first invention.

Figure 16B:
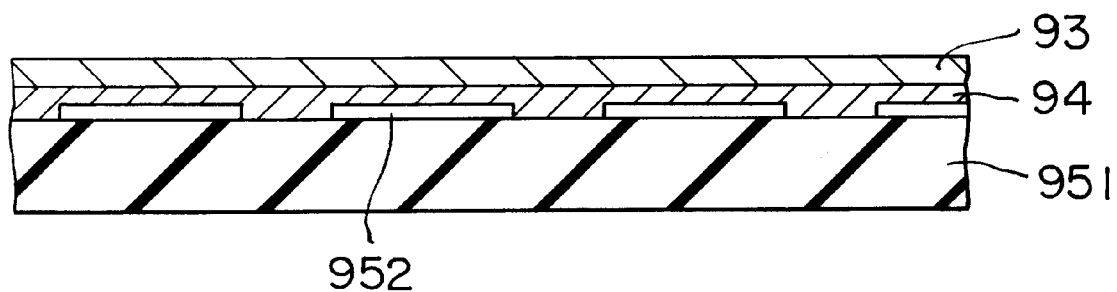
Figure 16C:
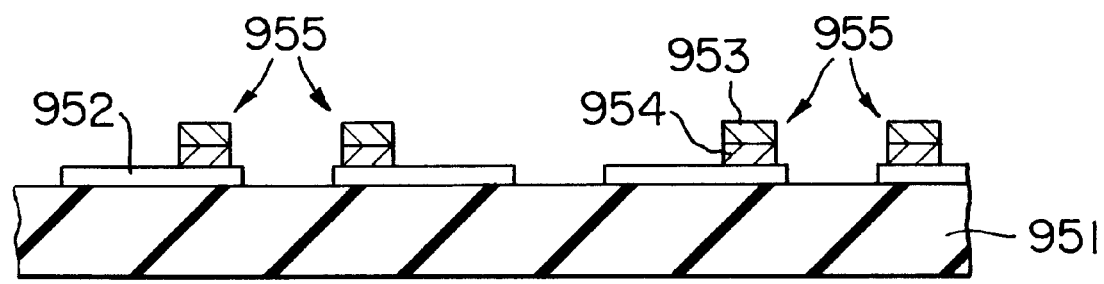

The exposed photosensitive conductive paste layer 93 and photosensitive black conductive paste layer 94 are transferred so as to cover a transparent electrode 952 provided on an insulating substrate 951 (FIG. 16B). Thereafter, the photosensitive conductive paste layer 93 and the photosensitive black conductive paste layer 94 are developed at a time and then fired to remove the resin component constituting the photosensitive conductive paste layer 93 and the photosensitive black conductive paste layer 94, thereby forming an electrode 955 having a two layer structure of a black conductive layer 954 and a main conductive layer 953 on the transparent electrode 952 (FIG. 16C).

Process for producing an electrode according to the fourth invention

FIG. 17 is a process diagram showing one embodiment of the process for producing an electrode of a plasma display panel according to the fourth invention. In FIG. 17, at the outset, the photosensitive conductive paste layer 93 and the photosensitive black conductive paste layer 94 in the transfer sheet 91 for an electrode according to the first or second invention are exposed through a mask M having a predetermined pattern (FIG. 17A). This exposure may be performed in the same manner as in the third invention.

The photosensitive conductive paste layer 93 and the photosensitive black conductive paste layer 94 are developed at a time to form a main conductive layer pattern 93' and a black conductive layer pattern 94' on the transfer support 92 (FIG. 17B).

The main conductive layer pattern 93' and the black conductive layer pattern 94' are transferred onto a transparent electrode 952, in its predetermined position, provided on an insulating substrate 51 and then fired to remove the resin component constituting the main conductive layer pattern 93' and the black conductive layer pattern 94', thereby forming an electrode 955 having a two layer structure of a black conductive layer 954 and a main conductive layer 953 (FIG. 17C).

Process for producing an electrode according to the fifth invention

FIG. 18 is a process diagram showing one embodiment of the process for producing an electrode of a plasma display panel according to the fifth invention. In FIG. 18, at the outset, a photosensitive black conductive paste layer 914 is transferred using the transfer sheet 911 for an electrode according to the third or fourth invention so as to cover a transparent electrode 952 provided on an insulating substrate 951 (FIG. 18A). A photosensitive conductive paste layer 923 is transferred using the transfer sheet 921 for an electrode according to the fifth or sixth invention onto the photosensitive black conductive paste layer 914 (FIG. 18B).

The photosensitive conductive paste layer 923 and the photosensitive black conductive paste layer 914 are exposed through a mask M having a predetermined pattern (FIG. 18C). In this exposure, light, which has been passed through the mask M and applied to the photosensitive conductive paste layer 923, exposes the photosensitive conductive paste layer 923 and, at the same time, is transmitted through the photosensitive conductive paste layer 923 to expose the photosensitive black conductive paste layer 914. In the above exposure, when the photosensitive conductive paste layer 923 has no adhesion to the mask M, the exposure may be performed with the mask M in intimate contact with the photosensitive conductive paste layer 923. On the other hand, when the photosensitive conductive paste layer 923 has adhesion to the mask M, it is preferred to provide a space between the mask M and the photosensitive conductive paste layer 923. Light sources usable herein are the same as those described above in connection with the process for producing an electrode according to the first invention.

The photosensitive conductive paste layer 923 and the photosensitive black conductive paste layer 914 are developed at a time and then fired to remove the resin component constituting the photosensitive conductive paste layer 923 and the photosensitive black conductive paste layer 914, thereby forming an electrode 955 having a two layer structure of a black conductive layer 954 and a main conductive layer 953 on the transparent electrode 952 (FIG. 18D).

Process for producing an electrode according to the sixth invention

Figure 19A:
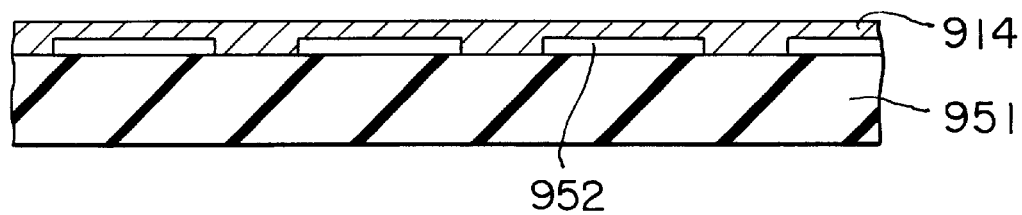
FIGS. 19A to 19C.
Figure 19B:
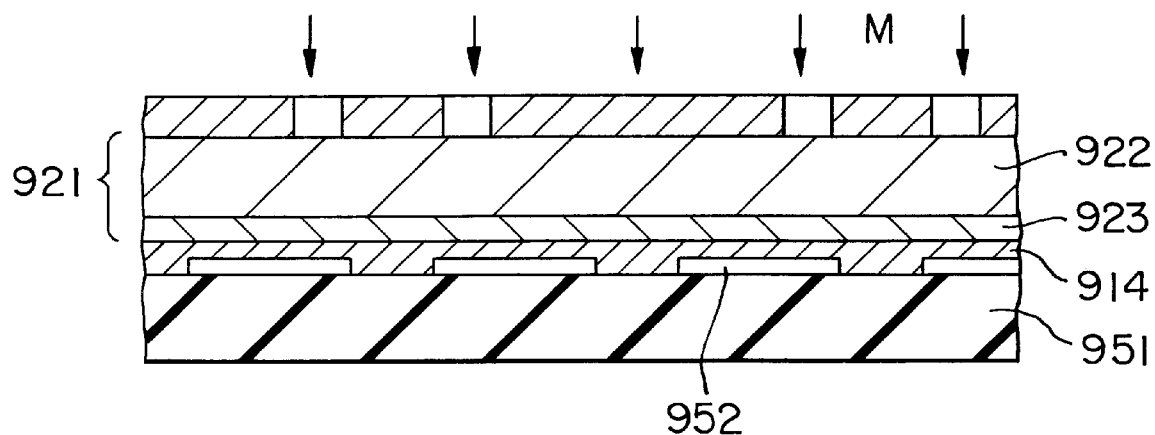
Figure 19C:
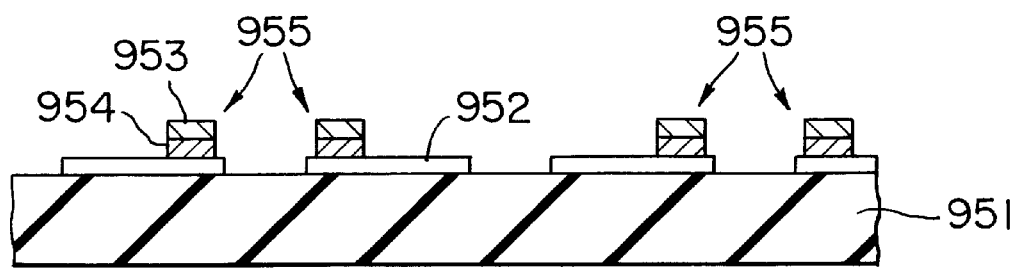

FIG. 19 is a process diagram showing one embodiment of the process for producing an electrode of a plasma display panel according to the sixth invention. In FIG. 19, at the outset, a photosensitive black conductive paste layer 914 is transferred using the transfer sheet 911 for an electrode according to the third or fourth invention so as to cover a transparent electrode 952 provided on an insulating substrate 951 (FIG. 19A). The photosensitive conductive paste layer 923 side of the transfer sheet 921 for an electrode according to the sixth invention is brought into contact with the top surface of the photosensitive black conductive paste layer 914 by pressure, and the photosensitive conductive paste layer 923 and the photosensitive black conductive paste layer 914 are exposed from above the transfer support 922 through a mask M having a predetermined pattern (FIG. 19B). In this exposure, light, which has been passed through the mask M, is transmitted through the transfer support 922 permeable to light to expose the photosensitive conductive paste layer 923 and, at the same time, is transmitted through the photosensitive conductive paste layer 923 to expose the photosensitive black conductive paste layer 914. By virtue of the exposure from above the transfer support 922, the exposure may be performed independently of the adhesion of the photosensitive conductive paste layer 923. Light sources usable herein are the same as those described above in connection with the process for producing an electrode according to the first invention.

Subsequently, the transfer support 922 is separated and removed to transfer the photosensitive conductive layer 923.

The photosensitive conductive paste layer 923 and the photosensitive black conductive paste layer 914 are developed at a time and then fired to remove the resin component constituting the photosensitive conductive paste layer 923 and the photosensitive black conductive paste layer 914, thereby forming an electrode 955 having a two layer structure of a black conductive layer 954 and a main conductive layer 953 on the transparent electrode 952 (FIG. 19D).

Process for producing an electrode according to the seventh invention

Figure 20A:
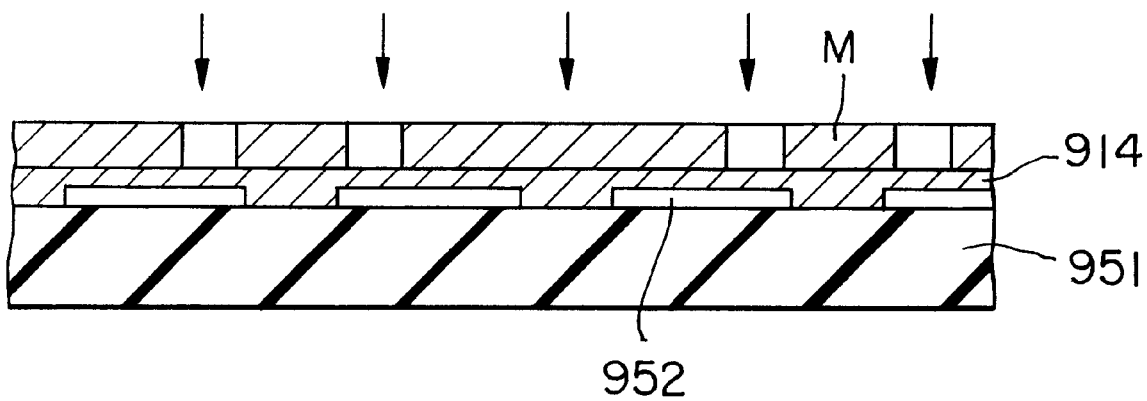
FIGS. 20A to 20C.

FIG. 20 is a process diagram showing one embodiment of the process for producing an electrode of a plasma display panel according to the seventh invention. In FIG. 20, at the outset, a photosensitive black conductive paste layer 914 is transferred using the transfer sheet 911 for an electrode according to the third or fourth invention so as to cover a transparent electrode 952 provided on an insulating substrate 951, and the photosensitive black conductive paste layer 914 is exposed through a mask M having a predetermined pattern (FIG. 20A).

Figure 20B:
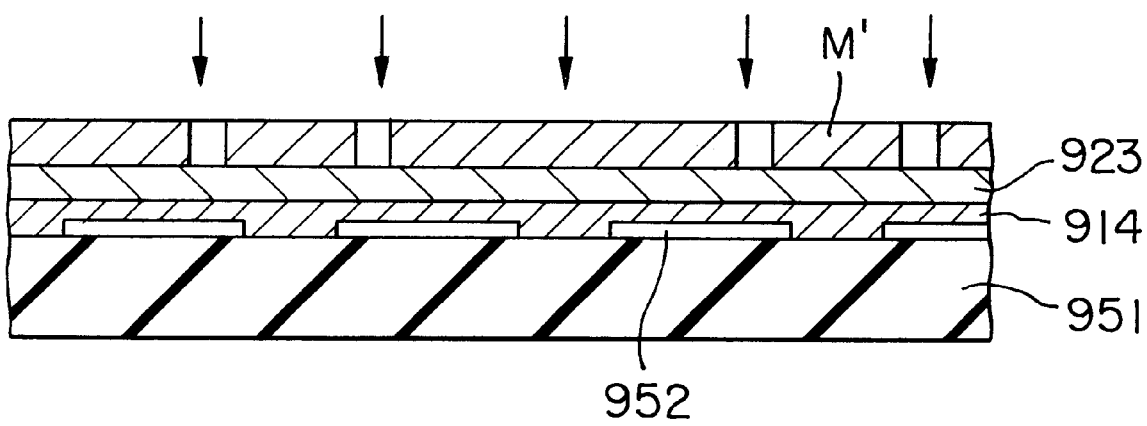

The photosensitive conductive paste layer 923 in the transfer sheet 921 for an electrode according to the fifth or sixth invention is transferred onto the photosensitive black conductive paste layer 914, and the photosensitive conductive paste layer 923 is exposed through a mask M' having a predetermined pattern (FIG. 20B). In this exposure, light, which has been passed through the mask M', exposes the photosensitive conductive paste layer 923 and, at the same time, is transmitted through the photosensitive conductive paste layer 923 and applied to the photosensitive black conductive paste layer 914. As shown in the drawing, the mask M' has an opening which overlaps with the opening of the mask M, avoiding unnecessary exposure of the photosensitive black conductive paste layer 914. In such exposure, when the photosensitive black conductive paste layer 914 has no adhesion to the mask M and the photosensitive conductive paste layer 923 has no adhesion to the mask M', the exposure may be performed with the masks M, M' in intimate contact respectively with the photosensitive black conductive paste layer 914 and the photosensitive conductive paste layer 923. On the other hand, when the photosensitive black conductive paste layer 914 and the photosensitive conductive paste layer 923 have an adhesive property, it is preferred to provide a space between the mask and the paste layer. Light sources usable herein are the same as those described above in connection with the process for producing an electrode according to the first invention.

Figure 20C:
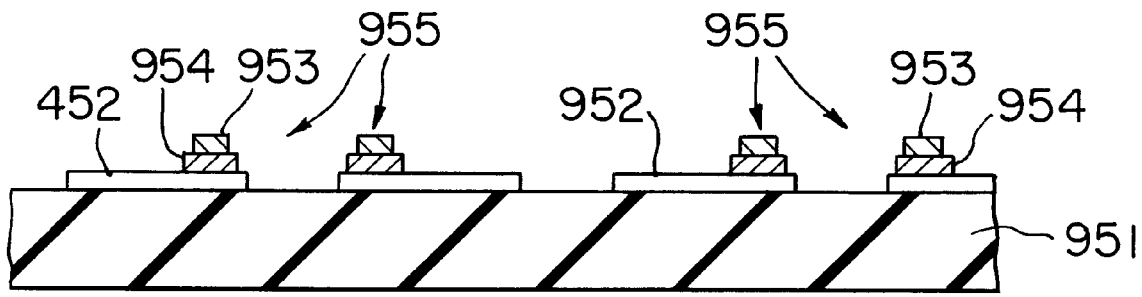

Subsequently, the photosensitive conductive paste layer 923 and the photosensitive black conductive paste layer 914 are developed at a time and then fired to remove the resin component constituting the photosensitive conductive paste layer 923 and the photosensitive black conductive paste layer 914, thereby forming an electrode 955 having a two layer structure of a black conductive layer 954 and a main conductive layer 953 on the transparent electrode 952 (FIG. 20C).

Process for producing an electrode according to the eighth invention

Figure 21A:
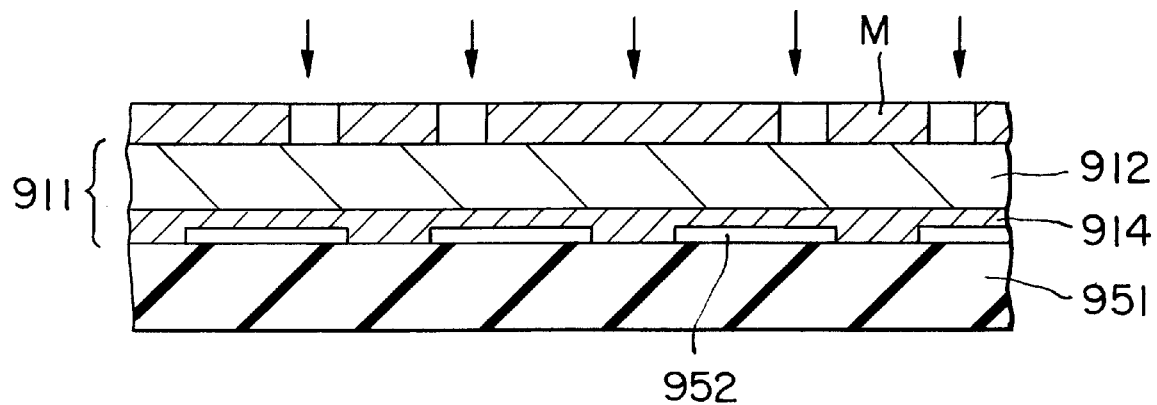
FIGS. 21A to 21C.

FIG. 21 is a process diagram showing one embodiment of the process for producing an electrode of a plasma display panel according to the eighth invention. In FIG. 21, at the outset, the photosensitive black conductive paste layer 914 side of the transfer sheet 911 for an electrode according to the fourth invention is brought into contact with an insulating substrate 951 having thereon a transparent electrode 952 by pressure so as to cover the transparent electrode 952, and the photosensitive black conductive paste layer 914 is exposed from above the transfer support 912 through a mask M having a predetermined pattern (FIG. 21A). In this exposure, light, which has been passed through the mask M, is transmitted through the transfer support 912 permeable to light to expose the photosensitive black conductive paste layer 914.

Figure 21B:
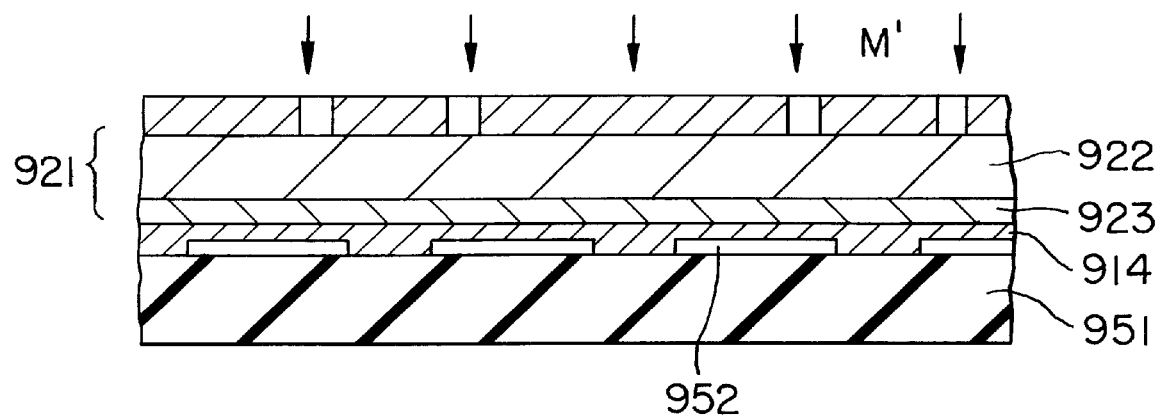

The transfer support 912 is then separated and removed, and the photosensitive conductive paste layer 923 side of the transfer sheet 921 for an electrode according to the sixth invention is brought into contact with the top surface of the photosensitive black conductive paste layer 914 by pressure, and the photosensitive conductive paste layer 923 is exposed from above the transfer support 922 through a mask M' having a predetermined pattern (FIG. 21B). In this exposure, light, which has been passed through the mask M' and transmitted through the transfer support 922, exposes the photosensitive conductive paste layer 923 and, at the same time, is transmitted through the photosensitive conductive paste layer 923 to expose the photosensitive black conductive paste layer 914. In this case, as shown in the drawing, the mask M' has an opening which overlaps with the opening of the mask M, avoiding unnecessary exposure of the photosensitive black conductive paste layer 914.

By virtue of the exposure from above the transfer support 912 or the transfer support 922, the exposure may be performed independently of the adhesive property of the photosensitive black conductive paste layer 914 and the photosensitive conductive paste layer 923. Light sources usable herein are the same as those described above in connection with the process for producing an electrode according to the first invention.

Figure 21C:
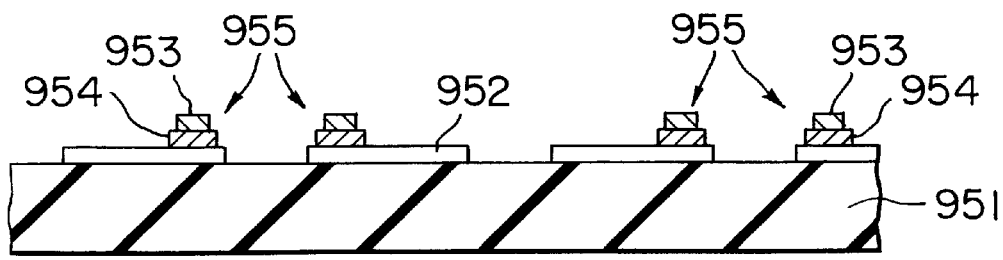

Subsequently, the transfer support 922 is separated and removed, and the photosensitive conductive paste layer 923 and the photosensitive black conductive paste layer 914 are developed at a time and then fired to remove the resin component constituting the photosensitive conductive paste layer 923 and the photosensitive black conductive paste layer 914, thereby forming an electrode 955 having a two layer structure of a black conductive layer 954 and a main conductive layer 953 on the transparent electrode 952 (FIG. 21C).

Process for producing an electrode according to the ninth invention

Figure 22:
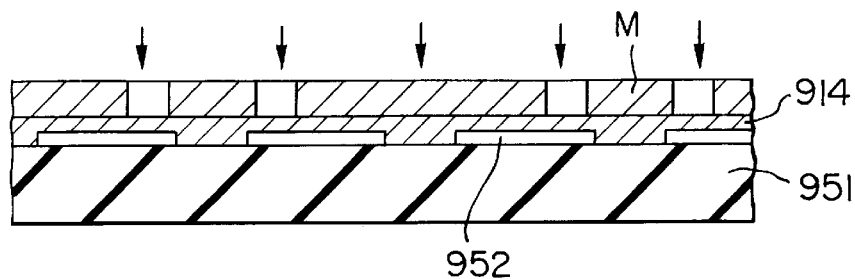
FIGS. 22A to 22E
Figure 22:
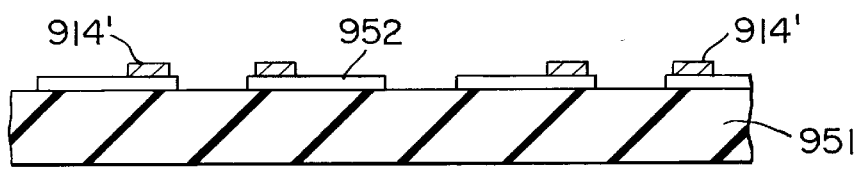
Figure 22:
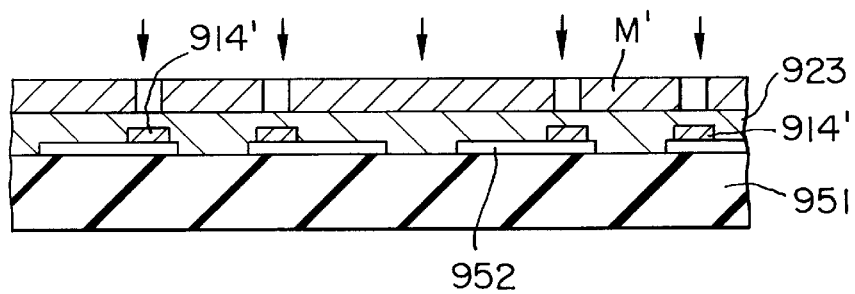
Figure 22:
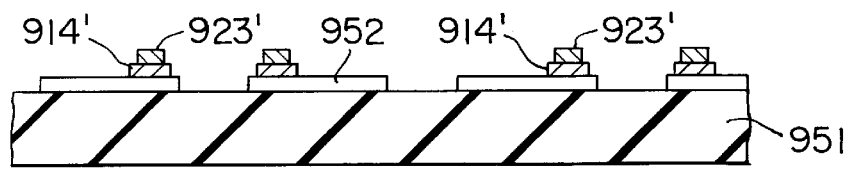
Figure 22:
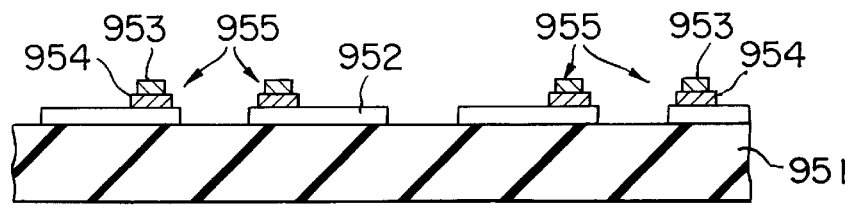

FIG. 22 is a process diagram showing one embodiment of the process for producing an electrode of a plasma display panel according to the ninth invention. In FIG. 22, at the outset, a photosensitive black conductive paste layer 914 is transferred using the transfer sheet 911 for an electrode according to the third or fourth invention so as to cover a transparent electrode 952 provided on an insulating substrate 951, and the photosensitive black conductive paste layer 914 is exposed through a mask M having a predetermined pattern (FIG. 22A).

The photosensitive black conductive paste layer 914 is developed to form a black conductive layer pattern 914' on the transparent electrode 952 (FIG. 22B). Thereafter, the photosensitive conductive paste layer 923 in the transfer sheet 921 for an electrode according to the fifth or sixth invention is transferred so as to cover the transparent electrode 952 and the black conductive layer pattern 914', and the photosensitive conductive paste layer 923 is exposed through a mask M' having a predetermined pattern (FIG. 22C). As shown in the drawing, the mask MI has an opening which overlaps with the opening of the mask M.

The photosensitive conductive paste layer 923 is developed to form a main conductive layer pattern 923' on the black conductive layer pattern 914' (FIG. 22D).

In the above exposure, when the photosensitive black conductive paste layer 914 has no adhesion to the mask M and the photosensitive conductive paste layer 923 has no adhesion to the mask M', the exposure may be performed with the masks M, M' in intimate contact respectively with the photosensitive black conductive paste layer 914 and the photosensitive conductive paste layer 923. On the other hand, when the photosensitive black conductive paste layer 914 and the photosensitive conductive paste layer 923 have an adhesive property, it is preferred to provide a space between the mask and the paste layer. Light sources usable herein are the same as those described above in connection with the process for producing an electrode according to the first invention.

Firing is then performed to remove the resin component constituting the main conductive layer pattern 923' and the black conductive layer pattern 914', thereby forming an electrode 955 having a two layer structure of a black conductive layer 954 and a main conductive layer 953 on the transparent electrode 952 (FIG. 22E).

Process for producing an electrode according to the tenth invention

FIG. 23 is a process diagram showing one embodiment of the process for producing an electrode of a plasma display panel according to the tenth invention. In FIG. 23, at the outset, the photosensitive black conductive paste layer 914 side of the transfer sheet 911 for an electrode according to the fourth invention is brought into contact with an insulating substrate 951 having thereon a transparent electrode 952 by pressure so as to cover the transparent electrode 952, and the photosensitive black conductive paste layer 914 is exposed from above the transfer support 912 through a mask M having a predetermined pattern (FIG. 23A). In this exposure, light, which has been passed through the mask M, is transmitted through the transfer support 912 permeable to light to expose the photosensitive black conductive paste layer 914.

Figure 23A:
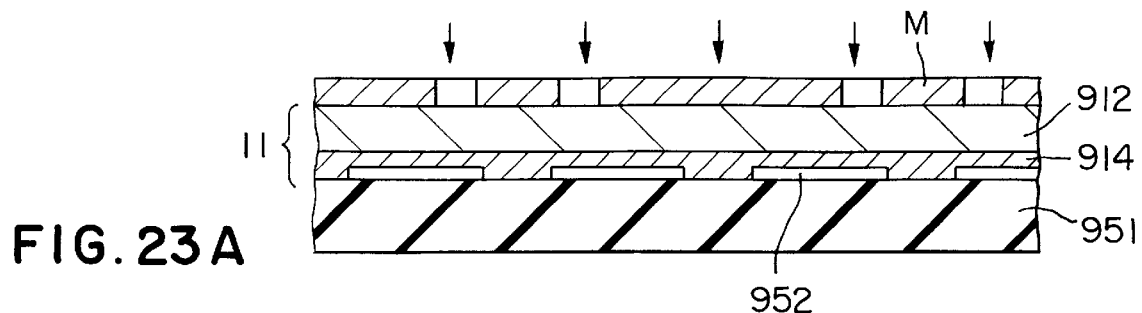
FIGS. 23A to 23E.
Figure 23B:
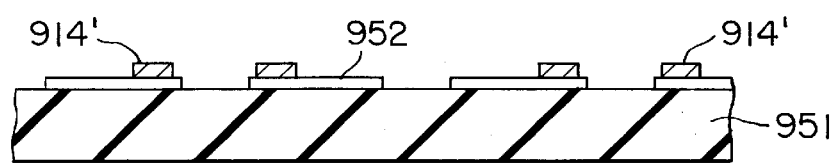

The transfer support 912 is separated and removed, and the photosensitive black conductive paste layer 914 is developed to form a black conductive layer pattern 914' on the transparent electrode 952 (FIG. 23B).

Figure 23C:
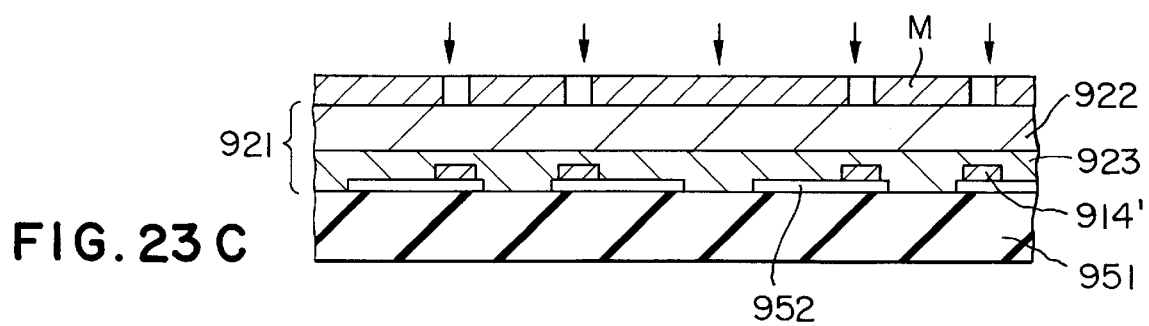

The photosensitive conductive paste layer 923 side of the transfer sheet 921 for an electrode according to the sixth invention is pressed so as to cover the transparent electrode 952 and the black conductive layer pattern 914', and the photosensitive conductive paste layer 923 is exposed from above the transfer support 922 through a mask M' having a predetermined pattern (FIG. 23C). As shown in the drawing, the mask M' has an opening which overlaps with the opening of the mask M.

By virtue of the exposure from above the transfer support 912 or the transfer support 922, the exposure may be performed independently of the adhesive property of the photosensitive black conductive paste layer 914 and the photosensitive conductive paste layer 923. Light sources usable herein are the same as those described above in connection with the process for producing an electrode according to the first invention.

Figure 23D:
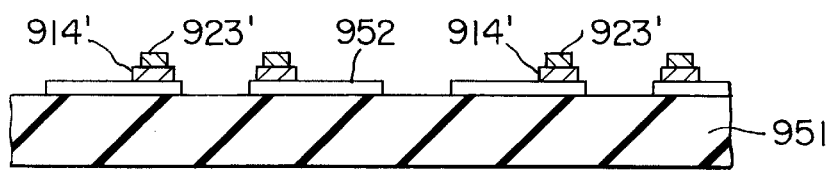

Subsequently, the transfer support 922 is separated and removed, and the photosensitive conductive paste layer 923 is developed to form a main conductive layer pattern 923' on the black conductive layer pattern 914' (FIG. 23D).

Figure 23E:
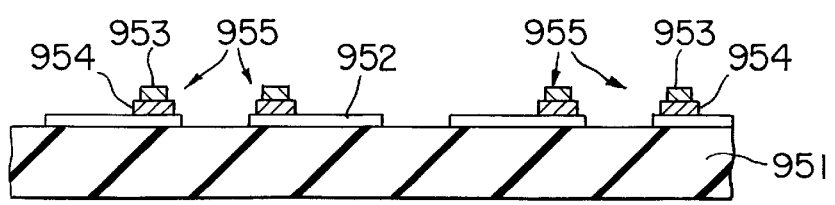

Firing is then performed to remove the resin component constituting the main conductive layer pattern 923' and the black conductive layer pattern 914', thereby forming an electrode 955 having a two layer structure of a black conductive layer 954 and a main conductive layer 953 on the transparent electrode 952 (FIG. 23E).

Process for producing an electrode according the eleventh invention

FIG. 24 is a process diagram showing one embodiment of the process for producing an electrode of a plasma display panel according to the eleventh invention. In FIG. 24, at the outset, the photosensitive black conductive paste layer 914 in the transfer sheet 911 for an electrode according to the third or fourth invention is exposed through a mask M having a predetermined pattern (FIG. 24A). In this exposure, when the photosensitive black conductive paste layer 914 has no adhesion to the mask M, the exposure may be performed with the mask M in intimate contact with the photosensitive conductive paste layer 914. On the other hand, when the photosensitive black conductive paste layer 914 has adhesion to the mask M, the exposure is preferably performed in such a state that a space is provided between the mask M and the photosensitive black conductive paste layer 914, or alternatively a protective film permeable to light may be provided. When the transfer sheet 911 according to the fourth invention wherein the transfer support 912 is permeable to light is used, exposure may be performed from the transfer support 912 side through the mask M. Light sources usable herein are the same as those described above in connection with the process for producing an electrode according to the first invention.

Figure 24A:
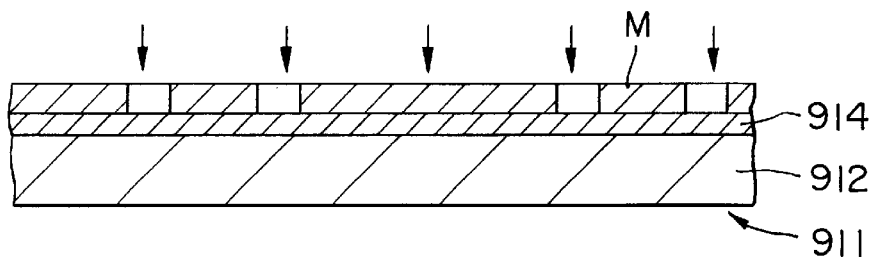
FIGS. 24A to 24E.
Figure 24B:
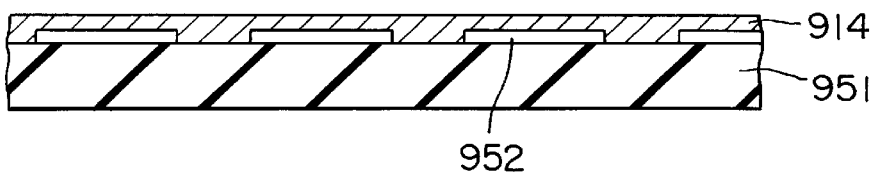

The exposed photosensitive black conductive paste layer 914 is then transferred so as to cover a transparent electrode 952 provided on an insulating substrate 951 (FIG. 24B).

Figure 24C:
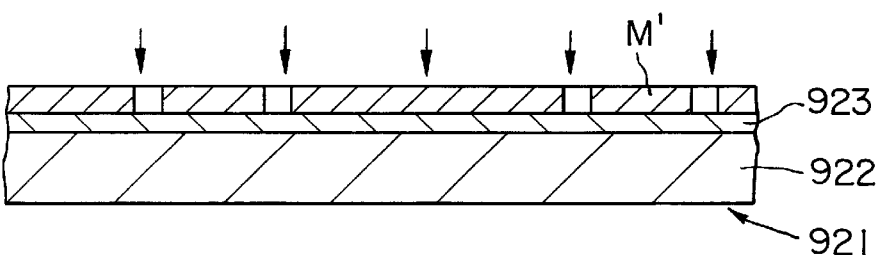

Separately, the photosensitive conductive paste layer 923 in the transfer sheet 921 for an electrode according to the fifth or sixth invention is exposed through a mask M' having a predetermined pattern (FIG. 24C). In this exposure, when the photosensitive conductive paste layer 923 has no adhesion to the mask M', the exposure may be performed with the mask M' in intimate contact with the photosensitive conductive paste layer 923. On the other hand, when the photosensitive conductive paste layer 923 has adhesion to the mask M', the exposure is preferably performed in such a state that a space is provided between the mask M' and the photosensitive conductive paste layer 923, or alternatively a protective film permeable to light may be provided. When the transfer sheet 921 according to the sixth invention wherein the transfer support 922 is permeable to light is used, exposure may be performed from the transfer support 922 side through the mask M'. Light sources usable herein are the same as those described above in connection with the process for producing an electrode according to the first invention.

Figure 24D:
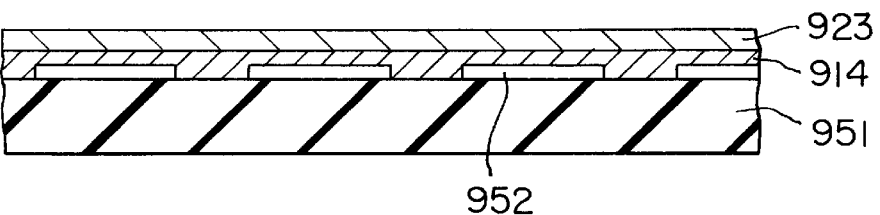

The exposed photosensitive conductive paste layer 923 is then transferred onto the photosensitive black conductive paste layer 914 (FIG. 24D).

Figure 24E:
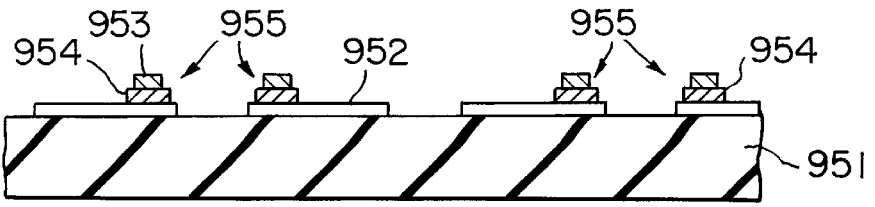

The photosensitive conductive paste layer 923 and the photosensitive black conductive paste layer 914 are developed at a time and then fired to remove the resin component constituting the photosensitive conductive paste layer 923 and the photosensitive black conductive paste layer 914, thereby forming an electrode having a two layer structure of a black conductive layer 954 and a main conductive layer 953 on the transparent electrode 952 (FIG. 24E).

Process for producing an electrode according the twelfth invention

FIG. 25 is a process diagram showing one embodiment of the process for producing an electrode of a plasma display panel according to the twelfth invention. In FIG. 25, at the outset, the photosensitive black conductive paste layer 914 in the transfer sheet 911 for an electrode according to the third or fourth invention is exposed through a mask M having a predetermined pattern (FIG. 25A). This exposure may be performed in the same manner as described above in connection with the process for producing an electrode according to the eleventh invention.

Figure 25A:
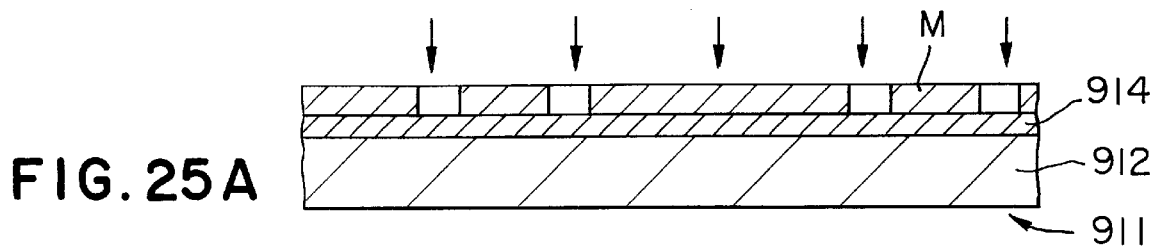
FIGS. 25A to 25F are process diagrams respectively showing embodiments of the process for producing an electrode of a plasma display panel according to the present invention.
Figure 25B:
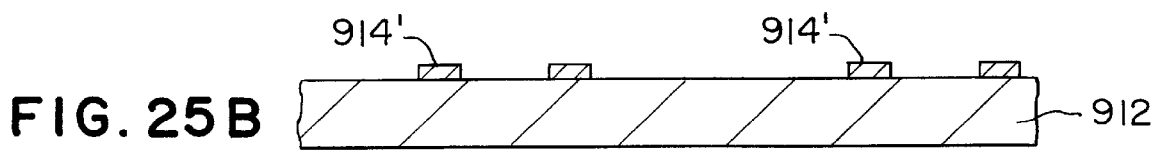
Figure 25C:
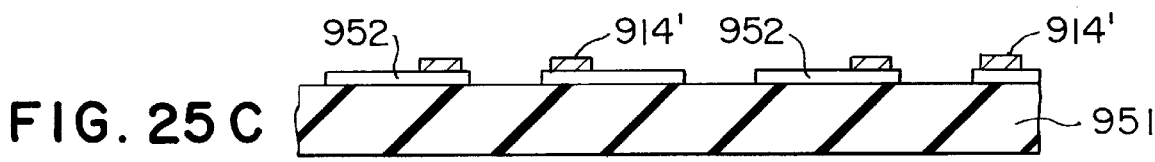

The photosensitive black conductive paste layer 914 is then developed to form a black conductive layer pattern 914' on the transfer support 912 (FIG. 25B). The black conductive layer pattern 914' is transferred onto a transparent electrode 952, in its predetermined position, on an insulating substrate 951 (FIG. 25C).

Figure 25D:
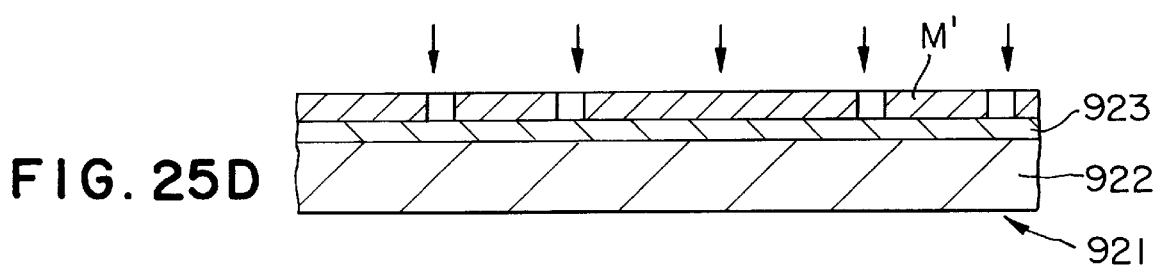

Separately, the photosensitive conductive paste layer 923 in the transfer sheet 921 for an electrode according to the fifth or sixth invention is exposed through a mask M' having a predetermined pattern (FIG. 25D). This exposure may be performed in the same manner as described above in connection with the process for producing an electrode according to the eleventh invention.

Figure 25E:
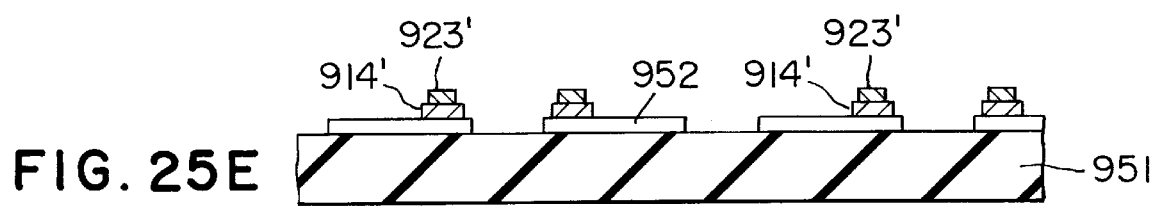

The photosensitive conductive paste layer 923 is then developed to form a main conductive layer pattern 923' on the transfer support 922, and the main conductive layer pattern 923' is transferred onto the black conductive layer pattern 914' (FIG. 25E).

Figure 25F:
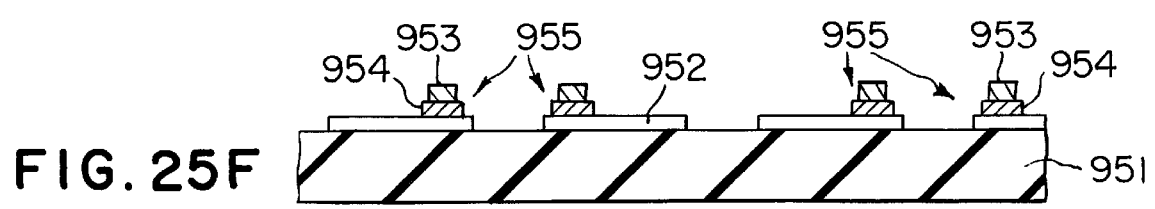

Subsequently, firing is performed to remove the resin component constituting the main conductive layer pattern 923' and the black conductive layer pattern 914', thereby forming an electrode 955 having a two layer structure of a black conductive layer 954 and a main conductive layer 953 on the transparent electrode 952 (FIG. 25F).

In the above-described electrode production processes, after the photosensitive conductive paste layer and the photosensitive black conductive paste layer are exposed, they may be developed with an aqueous sodium carbonate solution, an aqueous sodium hydroxide solution, an aqueous potassium hydroxide solution, an aqueous potassium carbonate solution, an organic alkali, such as monoethanolamine, or the like.

EXAMPLES

Example A1

As shown in FIG. 2A, a transparent electrode as a sustaining electrode 4 was formed on a glass 1 to serve as a front plate. Specifically, a first layer was formed using a transparent conductive film having a predetermined shape. The thickness of the transparent conductive film was about 0.05 to 0.4 $\mu$m. More specifically, $SnO_2$ was adhered onto a glass substrate to form a transparent conductive film, a resist layer was formed on an $SnO_2$ film using a liquid resist ("OMR85," manufactured by Tokyo Ohka Kogyo Co., Ltd., Japan) or a dry film resist ("Ordyl BF-205," manufactured by Tokyo Ohka Kogyo Co., Ltd.), and the resist layer was subjected to pattern exposure or development to form a resist pattern for a transparent electrode, followed by sandblasting to remove unnecessary areas of the $SnO_2$ film. In the sandblasting, alumina was used as an abrasive. The resist pattern was then separated to form a transparent electrode having a desired pattern.

Figure 2B:
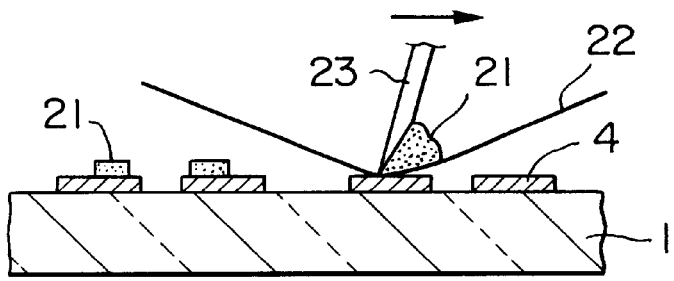
Figure 2C:
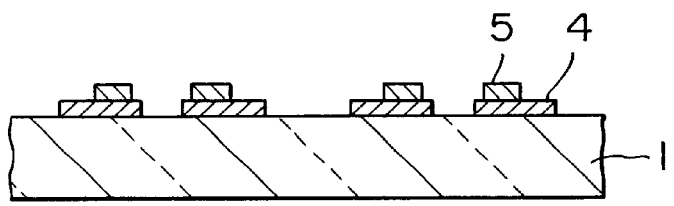

Use of the transparent electrode alone results in high resistance value, rendering the transparent electrode unsuitable as the electrode. Therefore, in order to lower the resistance value, a metallic electrode is formed using a conductive material on the transparent electrode. Conductive materials usable herein include a conductive paste containing any metallic powder of Ag, Au, Ni, or Al or a sheet prepared from the conductive paste. In this example, a conductive paste 21 composed mainly of Ag ("D590," manufactured by ESL) was used as the conductive material, and, as shown in FIG. 2B, is subjected to pattern coating in a metallic electrode form by screen printing. In the drawing, numeral 22 designates a screen plate, and numeral 23 a squeegee. Subsequently, the coating was dried at 170° C. and fired at 580° C. to form a metallic electrode as a bus electrode 5 as shown in FIG. 2C.

Figure 2D:
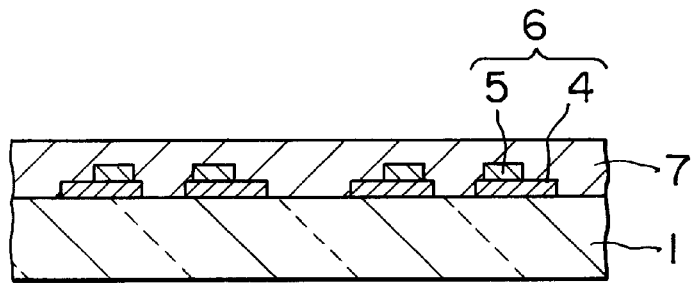

After the metallic electrode was formed in this way on the transparent electrode, a dielectric paste ("PLS-3232," manufactured by Nippon Electric Glass Co., Ltd.) was laminated to a thickness of 10 to 30 µm by screen printing or the like, and the laminate was fired to form a dielectric layer 7 as shown in FIG. 2D. The formation of the dielectric layer 7 permitted irregularities in the glass surface, which had been matted in a ground glass form by the sandblasting, to be filled with the dielectric layer, resulting in a 10% or more improvement in transmittance over that for the as sandblasted glass substrate.

In the above example, the transparent electrode was formed by sandblasting an $SnO_2$ film. ITO may be used as the transparent conductive film. Further, the transparent electrode may be formed by etching or lift off besides sandblasting.

Further, in the above example, a metallic electrode was formed after the formation of a transparent electrode on the glass substrate. Alternatively, a metallic electrode may be formed by screen printing followed by sandblasting to form a transparent electrode.

Example A2

At the outset, as shown in FIG. 3A, a transparent conductive film 31 and a metallic film 32 are formed on a glass substrate 1 to serve as a front plate. Specifically, $SnO_2$ is adhered by spraying onto the glass substrate 1, and a conductive paste composed mainly of Ag ("D590," manufactured by ESL) was coated on the whole area by screen printing or the like. The coating was dried at 170° C. and then fired at 580° C. A resist layer was formed on the metal film 32 using a liquid resist ("OFPR800," manufactured by Tokyo Ohka Kogyo Co., Ltd. Japan) or a dry film resist ("Ordyl α-530," manufactured by Tokyo Ohka Kogyo Co., Ltd.), and the resist layer was subjected to pattern exposure or development to form a resist pattern 33, as shown in FIG. 3B, which is the same pattern as a bus electrode 5. Subsequently, etching was performed with an aqueous $Fe(NO_3)_3$ solution or an aqueous $HNO_3$ solution (the concentration for each aqueous solution being 20 to 50% by weight), and the resist pattern 33 was separated and removed to form a metallic electrode as a bus electrode 5, as shown in FIG. 3C.

Figure 3E:
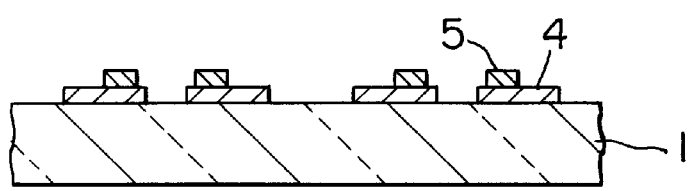

Thereafter, a dry film resist ("Ordyl BF-205," manufactured by Tokyo Ohka Kogyo Co., Ltd.) was used to again form a resist layer, followed by pattern exposure and development to form a resist pattern 34, as shown in FIG. 3D, which is the same pattern as a transparent electrode, followed by sandblasting to remove unnecessary areas of the transparent conductive film 31. In the sandblasting, alumina was used as an abrasive. Since the metallic electrode is covered with the resistance, it is not ground by the sandblasting. The resist pattern 34 is separated and removed to form a transparent electrode as a sustaining electrode 4 (FIG. 3E).

Figure 3F:
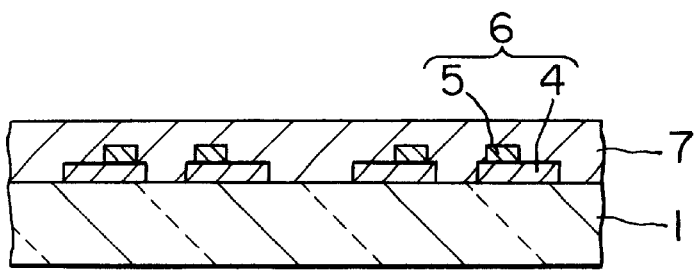

After a composite electrode 6 was formed in this way, a dielectric paste ("PLS-3232," manufactured by Nippon Electric Glass Co., Ltd.) was laminated to a thickness of 10 to 30 µm by screen printing or the like, followed by firing to form a dielectric layer 7 as shown in FIG. 3F. The formation of the dielectric layer 7 permitted irregularities in the glass surface, which had been matted in a ground glass form by the sandblasting, to be filled with the dielectric layer, resulting in a 10% or more improvement in transmittance over that for the as sandblasted glass substrate.

Example A3

Figure 4A:
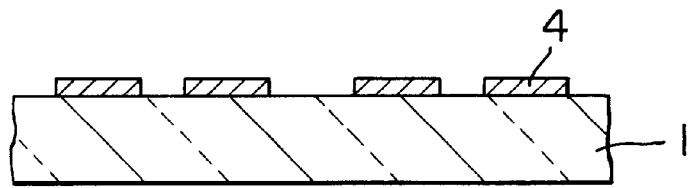
FIGS. 4A to 4E are a process diagram showing a third embodiment for forming a composite electrode on a front plate.

At the outset, as shown in FIG. 4A, a transparent electrode as a sustaining electrode 4 is formed on a glass substrate 1 to serve as a front plate. It is formed in the same manner as in Example A1. Use of the transparent electrode alone results in high resistance value, rendering the transparent electrode unsuitable as the electrode. Therefore, in order to lower the resistance value, a metallic electrode is formed on the transparent electrode. In this example, the metallic electrode was formed as follows.

Figure 4B:
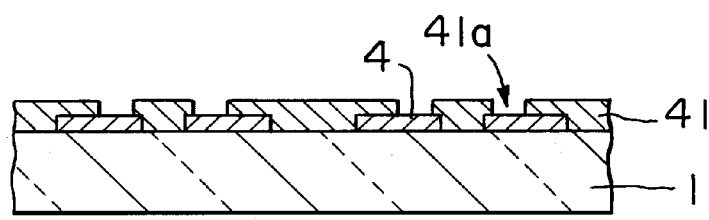
Figure 4C:
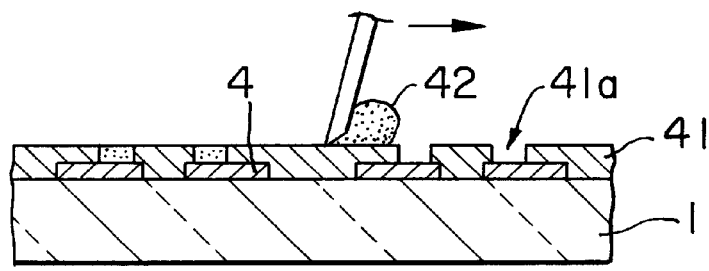
Figure 4D:
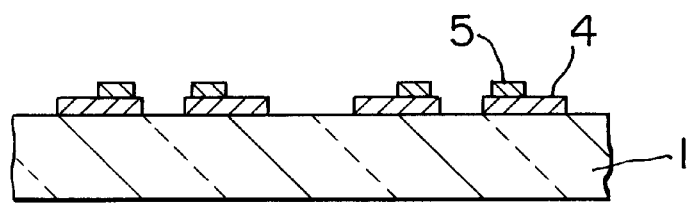

A resist layer was formed on a transparent electrode using a liquid resist ("OFPR800," manufactured by Tokyo Ohka Kogyo Co., Ltd.) or a dry film resist ("Ordyl α-530," manufactured by Tokyo Ohka Kogyo Co., Ltd.), and the resist layer was subjected to pattern exposure and development to form a resist pattern 41 having a recess 41a corresponding to a bus electrode as shown in FIG. 4B. Subsequently, as shown in FIG. 4C, the recess 41a was filled with a conductive paste 42 ("D590", manufactured by ELS) composed mainly of Ag, and the paste 42 was dried at 150° C. The resist pattern 41 was separated and removed, and the conductive paste 42 was fired to form a metallic electrode as a bus electrode 5, as shown in FIG. 4D.

Figure 4E:
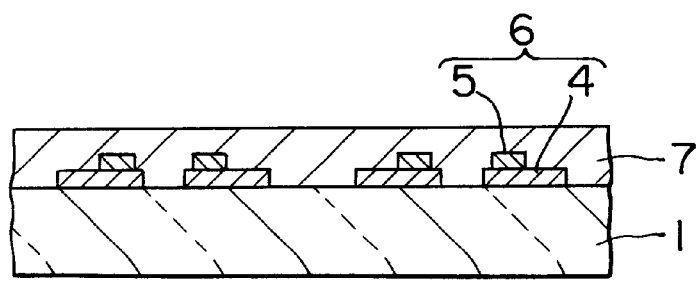

After a metallic electrode was formed in this way on the transparent electrode, a dielectric paste ("PLS-3232," manufactured by Nippon Electric Glass Co., Ltd.) was laminated by screen printing or the like to a thickness of 10 to 30 µm and fired to form a dielectric layer 7 as shown in FIG. 4E. The formation of the dielectric layer 7 permitted irregularities in the glass surface, which had been matted in a ground glass form by the sandblasting, to be filled with the dielectric layer, resulting in a 10% or more improvement in transmittance over that for the as sandblasted glass substrate.

Example A4

Figure 5A:
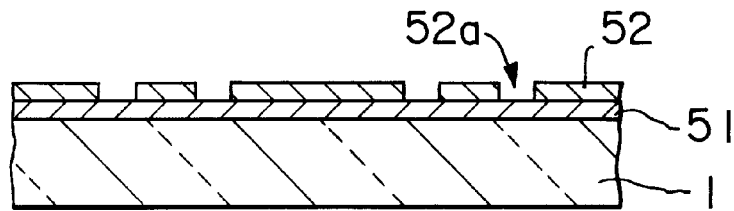
FIGS. 5A to 5E are a process diagram showing a fourth embodiment for forming a composite electrode on a front plate.
Figure 5B:
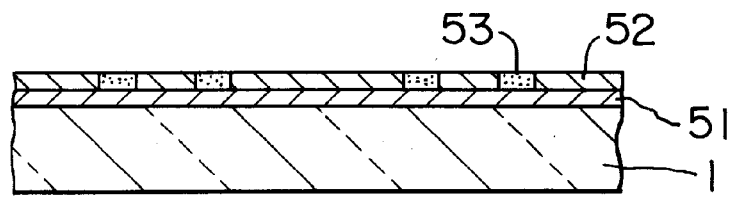
Figure 5C:
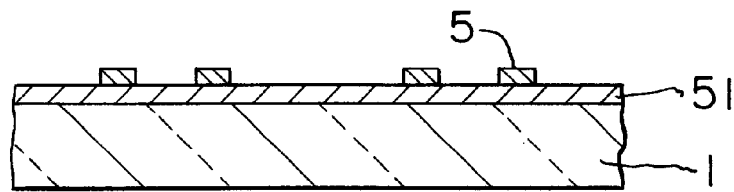

At the outset, as shown in FIG. 5A, $SnO_2$ was adhered onto a glass substrate 1 to serve as a front plate 1 by spraying or the like to form a transparent conductive film 51, a resist layer was formed on the transparent conductive film 51 using a liquid resist ("OFPR800," manufactured by Tokyo Ohka Kogyo Co., Ltd.) or a dry film resist ("Ordyl α-530," manufactured by Tokyo Ohka Kogyo Co., Ltd.), and the resist layer was subjected to pattern exposure and development to form a resist pattern 52 having a recess 52a corresponding to a bus electrode 5 as shown in the drawing. Thereafter, as shown in FIG. 5B, the recess 52a was filled with a conductive paste 53 composed mainly of Ag ("D590," manufactured by ESL), and the dielectric paste 53 was dried at 150° C. Subsequently, the resist pattern 52 was separated and removed, and the conductive paste 53 was fired to form a metallic electrode as a bus electrode 5 as shown in FIG. 5C.

Figure 5D:
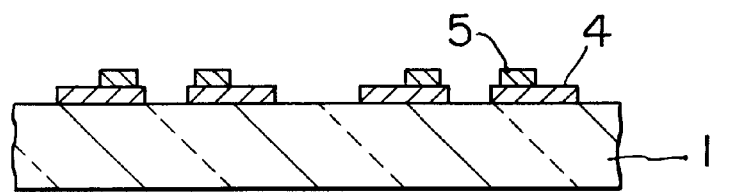
Figure 5E:
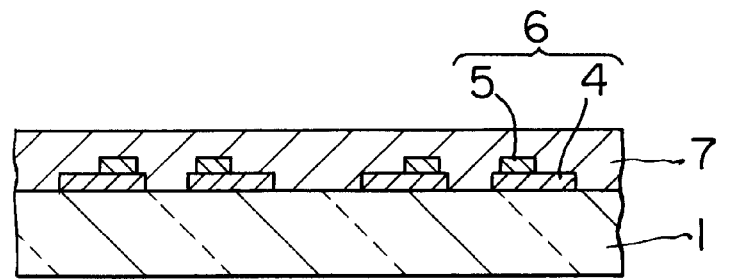

Then, the transparent conductive film 51 was patterned to form a transparent electrode as a sustaining electrode 4, as shown in FIG. 5D. The transparent electrode was formed in the same manner as in Example A2. Thus, a composite electrode 6 was formed, and a dielectric paste ("PLS-3232," manufactured by Nippon Electric Glass Co., Ltd.) was laminated by screen printing or the like to a thickness of 10 to 30 µm, and the laminate was fired to form a dielectric layer 7 as shown in FIG. 5E. The formation of the dielectric layer 7 permitted irregularities in the glass surface, which had been matted in a ground glass form by the sandblasting, to be filled with the dielectric layer, resulting in a 10% or more improvement in transmittance over that for the as sandblasted glass substrate.

Example A5

Figure 6A:
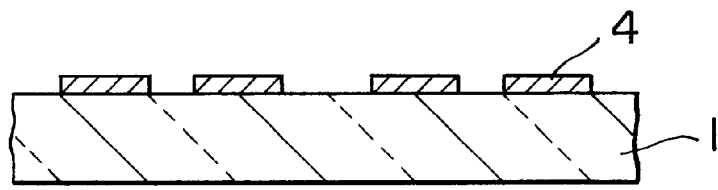
FIGS. 6A to 6E are a process diagram showing a fifth embodiment for forming a composite electrode on a front plate.

At the outset, as shown in FIG. 6A, a first layer is formed using a transparent conductive film having a predetermined shape on a glass plate 1 to serve as a front plate. That is, a transparent electrode as a sustaining electrode 4 is formed. Possible materials for the transparent conductive film include ITO and $SnO_2$. When ITO is used, a film may be formed by sputtering or vacuum deposition followed by etching according to a conventional method. On the other hand, when $SnO_2$ is used, it is possible to use a method which comprises the steps of: first forming a mask layer, on a glass substrate 1, having a pattern reverse to the pattern of the sustaining electrode 4; forming a film by CVD or spraying; subsequently separating and removing the mask layer to perform pattering. An alternative method usable herein comprises adhering $SnO_2$ by spraying or the like to form a film, forming a mask layer having the same pattern as the sustaining electrode 4, performing patterning by sandblasting or the like, and separating and removing the mask layer. The thickness of the transparent conductive film is about 0.05 to 0.4 $\mu$m.

Specifically, a 0.15 $\mu$m-thick ITO film was formed as a transparent conductive film by sputtering on a soda lime glass plate, a mask layer was formed using a photoresist ("OFPR800," manufactured by Tokyo Ohka Kogyo Co., Ltd.) on the ITO film, ITO was etched in an aqueous solution composed of a 1:1:0.08 mixture of water, hydrochloric acid, and nitric acid, the photoresist was separated and removed, and the substrate was then washed with water and dried to form a sustaining electrode 4 having a line width of 188 $\mu$m.

Figure 6B:
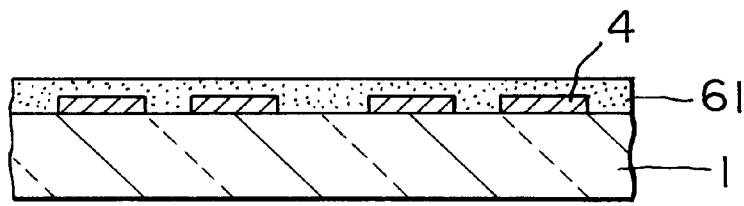

Subsequently, a second layer to serve as a bus electrode 5 is formed using a photosensitive conductive material as follows. At the outset, as shown in FIG. 6B, a film of a photosensitive conductive material 61 is formed on the substrate having thereon the sustaining electrode 4. In this stage, the photosensitive conductive material 61 is formed in a larger pattern than a desired final shape, that is, the pattern of the bus electrode 5, and, in a later step, is trimmed. The photosensitive conductive material 61 may be a paste comprising a photosensitive material and a metallic powder and sensitive to irradiation with light such as ultraviolet light. For example, a photopolymerizable paste described in Japanese Patent Laid-Open No. 41985/1975 may be used. Metallic powders contained in conventional photopolymerizable pastes include powders of Ag, Au, Pt, and Cu. Among them, an Ag powder is most preferred from the viewpoints of cost and heat resistance. When the photosensitive conductive material 61 is in the form of a paste, it may be coated on the substrate by screen printing or the like and dried to form (a film of the photosensitive conductive material 61.

In the present example, a negative-working photosensitive paste composed of a) an Ag powder, b) an acrylic copolymer having a carboxyl group and an ethylenically unsaturated group on its side chain, and c) e photoreactive compound, and d) a photopolymerization initiator was used as a photosensitive conductive material. This paste was coated by screen printing on the whole surface of the glass substrate with the sustaining electrode formed thereon and then dried in an oven at 100° C. for 30 min to form a film of the photosensitive conductive material having a thickness of 10 $\mu$m.

Figure 6C:
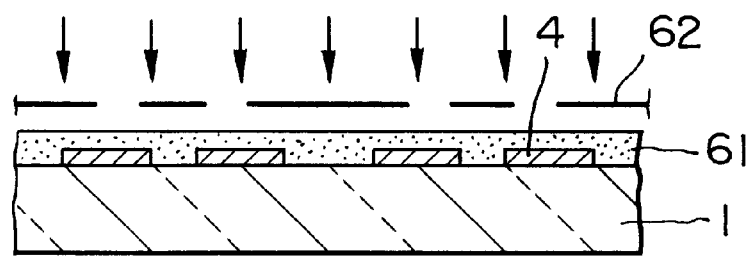
Figure 6D:
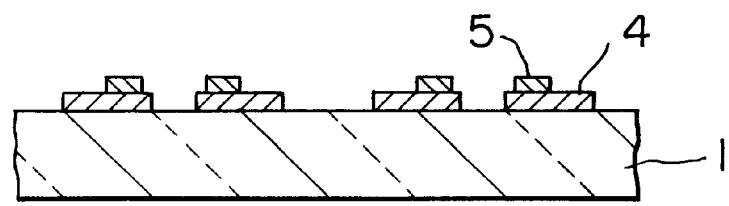

Then, as shown in FIG. 6C, the photosensitive conductive material 61 is exposed through a photomask 62. When the photosensitive conductive material 61 is of negative-working type, that is, photocurable, exposure may be performed in the form of the bus electrode 5. On the other hand, when the photosensitive conductive material 61 is of positive-working type, exposure may be performed in a pattern reverse to the pattern of the bus electrode 5. In general, the line width of the bus electrode 5 is not more than ½ of the line width of the sustaining electrode 4. Subsequently, as shown in FIG. 6D, the film of the photosensitive conductive material 61 in its unnecessary areas is removed to complete a composite electrode 6. When the photosensitive conductive material 61 is of negative-working type, unexposed areas are removed, while in the case of the positive-working type, exposed areas are removed. When the above polymerizable paste is used as the photosensitive conductive material 61, unnecessary areas are removed with a suitable solvent followed by firing at least 400° C. to burn off the organic component in the paste, thereby sintering the metallic powder.

Specifically, the photosensitive conductive material film is exposed to UV in a bus electrode pattern having a line width of 64 $\mu$m and sprayed with a 0.2 wt % aqueous sodium carbonate solution to remove unexposed areas, and the substrate was washed with water and dried to pattern the photosensitive conductive material, thereby creating a bus electrode pattern. Further, firing was performed at 580° C. for 10 min to burn off the organic component of the photosensitive conductive material and, at the same time, to sinter the Ag powder to form a bus electrode having a final thickness of 5 $\mu$m and a sheet resistance of 6.0 m$\Omega$. The sheet resistance required of the bus electrode 5 is not more than 20 m$\Omega$ for PDP of class 40 in. although it varies depending upon the definition of the panel and the bus electrode width. The bus electrode 5 formed in this example well satisfies this requirement.

Figure 6E:
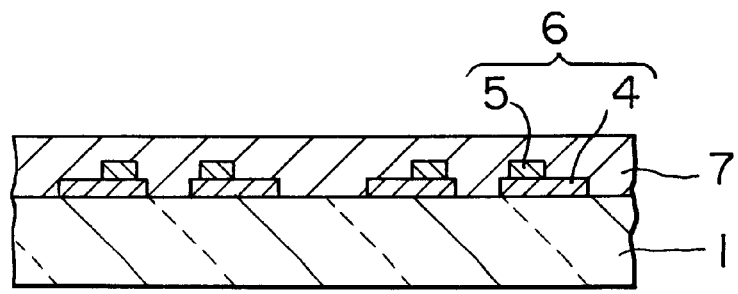

Thus, after a composite electrode 6 is formed in this way on a glass substrate 1 to serve as a front plate, a dielectric paste is laminated to 10 to 30 $\mu$m by screen printing or the like, followed by firing to form a dielectric layer 7 as shown in FIG. 6E. Thereafter, the other components are formed by the conventional process to prepare PDP. Thus, since both the sustaining electrode 4 and the bus electrode 5 are formed by photolithography, the formation accuracy and the alignment accuracy are better than those in the case of the screen printing. Further, in the formation of the bus electrode 5, no vacuum film formation process, such as sputtering or vacuum deposition, is used, and no etching is required, offering advantages of productivity and production cost over the film process.

Specifically, a dielectric layer and a protective layer were formed by a conventional method on the substrate having thereon the composite electrode 6 to complete a front plate. The front plate was combined with a back plate formed by a conventional method, followed by filling of a gas to complete a panel. An actual panel lighting test was performed. As a result, the drive voltage and the panel brightness were similar to those attained by the conventional panel with a bus electrode of Cr/Cu/Cr.

Example A6

In Example A5, a photosensitive paste containing an Ag powder was used as the photosensitive conductive material 61. In this case, the bus electrode 5 was observed after sintering and found to have a silver-gray color characteristic of silver. For this reason, when an Image is displayed using the completed panel and observed with the naked eye, the image is viewed in a somewhat raised state. Specifically, in an AC type PDP shown in FIG. 1, as described above, the bus electrode 5 serves also as the black matrix. However, in the case of the silver-gray tone, the bus electrode does not satisfactorily function as the black matrix. In such a case, a black pigment is incorporated into the photosensitive conductive material 61 to deepen the tone of the bus electrode 5. Black pigments usable herein include carbon black; titanium black; oxides, composite oxides, nitrides, and carbides of transition metals, such as Ni, Cr, Mn, Cu, and Fe; and mixtures of the above pigments. Among them, carbon black is best suited as the black pigment from the viewpoints of conductivity and cost.

In this example, carbon black ("Diacarbon," manufactured by Mitsubishi Chemical Corporation) was incorporated into the photosensitive paste in Example A5 by means of a triple roll mill to prepare a photosensitive paste containing a black pigment, and a composite electrode 6 was formed in the same manner as in Example A5, except that this paste was used. This caused the tone of the bus electrode 5 to be changed from silver gray to dark gray. A panel provided with the electrode prepared in the present example was tested for lightening. As a result, it was found that the contrast of the displayed image was improved over that prepared in Example A5.

As described above, the electrode for PDP according to the present invention comprises a first layer of a transparent conductive film and a second layer of a conductive material, the conductive material being a conductive paste or a sheet of a conductive paste. By virtue of this constitution, it is possible to use means such as (a) screen printing of a conductive paste, (b) etching of a conductive material, (c) filling of a conductive paste, and (d) photolithography using a photosensitive conductive material. This eliminates the need to use any vacuum device unlike the conventional method wherein a metallic film is formed by utilizing a thin film forming technique such as sputtering or vapor deposition. Therefore, the time taken for the treatment of the substrate can be shortened to enhance the production efficiency. Further, unlike the conventional method wherein the substrate is accommodated in a vacuum device, there is no limitation on the size of the substrate, permitting the present invention to easily cope with an increase in the size of the panel.

Further, the incorporation of the black pigment into the conductive material permits the electrode to serve as a black matrix, resulting in improved image contrast of the panel.

Example B1

A photosensitive paste composed of: 20 parts by weight of a photosensitive resin component composed of 50 parts by weight of a binder polymer, with an acid value of 100 mg KOH/g, composed of methacrylate and methacrylic acid, 25 parts by weight of polyoxyethylated trimethylolpropane triacrylate, and 5 parts by weight of a photoinitiator ("Irgacure 369," manufactured by CIBA-GEIGY); 100 parts by weight of a silver powder, 5 parts by weight of a glass frit having a softening point of 550° C.; and 20 parts by weight of 3-methoxybutyl acetate was coated on a polyethylene terephthalate film, and the coating was dried and then laminated onto a glass substrate at 90° C. The laminate was irradiated with ultraviolet light through a predetermined mask, the film was separated and removed, and development was performed with a 0.2% aqueous sodium carbonate solution, followed by sintering at 600° C. to form an electrode pattern having a thickness of 10 μm and a width of 70 μm for use as an address electrode for PDP.

Example B2

A photosensitive paste composed of: 20 parts by weight of a photosensitive resin component composed of 100 parts by weight of a binder polymer prepared by adding 7% by mole of glycidyl methacrylate to a copolymer of ethyl methacrylate with methacrylic acid to give an acid value of 100 mg KOH/g, 60 parts by weight of polyoxyethylated trimethylolpropane triacrylate, and 10 parts by weight of a photoinitiator ("Irgacure 907," manufactured by CIBA-GEIGY); 100 parts by weight of a silver powder, 5 parts by weight of a glass frit having a softening point of 480° C.; and 20 parts by weight of propylene glycol monomethyl ether was coated on a polyethylene terephthalate film, and the coating was dried. A PE film was laminated thereon and rolled. The roll was then laminated onto a glass substrate at 90° C. by means of an automatic cut-off laminator. The polyethylene terephthalate film was separated and removed, and ultraviolet light was applied through a predetermined mask. The film was separated and removed, and development was performed with a 0.5% aqueous sodium carbonate solution, followed by sintering at 580° C. to form an electrode pattern having a thickness of 10 μm and a width of 70 μm for use as an address electrode for PDP.

As described above, in the method for a thick film pattern formation according to the present invention, after the formation of a pattern forming layer on a film by coating a photosensitive paste on the film, the pattern forming layer is disposed on a substrate to expose the pattern forming layer, simplifying the process and enabling the formation of a pattern having an even film thickness.

Example C

At the outset, a photosensitive conductive paste having the following composition was prepared. (Composition of photosensitive conductive paste)

| | |
|---|---|
| Methyl methacrylate/methacrylic acid copolymer with glycidyl methacrylate added thereto (acid value 100 mg KOH/g) | 10 parts by weight |
| Ethylene oxide-modified trimethylolpropane triacrylate | 6 parts by weight |
| Polymerization initiator (Iracure 369, manufactured by CIBA-GEIGY) | 1 part by weight |
| Polydimethyl siloxane (TSF451-1000, manufactured by Toshiba Silicone Co., Ltd.) | 0.1 part by weight |
| Dipropylene glycol monomethyl ether | 10 parts by weight |
| Ag powder | 70 parts by weight |
| Glass frit (softening point 550° C., coefficient of thermal expansion 80 × $10^{-7}$/° C.) | 4 parts by weight |

5 parts by weight of titanium black (average particle diameter 1.3 μm) was added to 100 parts by weight of the above photosensitive conductive paste to prepare a photosensitive black conductive paste.

Thereafter, the photosensitive black conductive paste was coated by screen printing on a glass plate with a patterned transparent electrode (line width 150 μm) of indium tin oxide (ITO) formed thereon, and the coating was dried to form a 3 μm-thick photosensitive black conductive paste coating (corresponding to FIG. 8A). Subsequently, the above photosensitive conductive paste was coated by screen printing on the photosensitive black conductive paste coating to form a coating which was then dried to form a 12 μm-thick photosensitive conductive paste coating. Thereafter, ultraviolet light was applied through a mask having an opening of line with 50 μm to expose at a time the photosensitive black conductive paste coating and the photosensitive conductive paste coating (corresponding to FIG. BB).

Development was then performed with an aqueous 0.5% Na₂CO₃ solution, followed by firing at a peak temperature of 570° C. to form an electrode having a two layer structure of a black conductive layer and a main conductive layer (line width 40 μm, thickness 9 μm) on the ITO transparent electrode (corresponding to FIG. 8C).

A plasma display panel was prepared using the glass substrate with an electrode, having a two layer structure, formed on an ITO transparent electrode. As a result, the plasma display panel had high display contrast and color purity and excellent display quality.

The above example was carried out by the method for electrode formation according to the first invention (embodiment [C]). It is a matter of course that the method for electrode formation according to the second invention and the method for electrode formation according to the third invention also can provide a plasma display panel having markedly decreased electric resistance of the ITO transparent electrode, high display contrast and color purity and excellent display quality.

As is apparent from the foregoing detailed description, according to the present invention, a photosensitive black conductive paste containing a black pigment and a photosensitive conductive paste are used to form an electrode (a bus electrode) having a two layer structure of a black conductive layer and a main conductive layer on a transparent electrode in an insulating substrate. The main conductive layer in the electrode having a two layer structure decreases the electric resistance of the transparent electrode, while the black conductive layer permits the main conductive layer to improve the connection to the transparent electrode and, at the same time, can enhance the contrast and color purity of the display panel. The above construction of the electrode can realize high display quality even in a high-definition or large-area plasma display panel. Further, the present invention can advantageously eliminate the need to use any photoresist and, hence, simplifies the process and, in addition, has the effect of offering higher electrode formation accuracy than the printing method.

Example D1

At the outset, a photosensitive conductive paste having the following composition was prepared. (Composition of photosensitive conductive paste)

| | |
|---|---|
| Methyl methacrylate/methacrylic acid copolymer with glycidyl methacrylate added thereto (acid value 100 mg KOH/g) | 10 parts by weight |
| Ethylene oxide-modified trimethylolpropane triacrylate | 6 parts by weight |
| Polymerization initiator (Iracure 369, manufactured by CIBA-GEIGY) | 1 part by weight |
| Propylene glycol monomethyl ether | 10 parts by weight |
| Ag powder | 70 parts by weight |
| Glass frit (softening point 550° C., coefficient of thermal expansion 80 × 10⁻⁷/° C.) | 4 parts by weight |

5 parts by weight of titanium black (average particle diameter 1.3 μm) was added to 100 parts by weight of the above photosensitive conductive paste to prepare a photosensitive black conductive paste.

Thereafter, the above photosensitive conductive paste was gravure-coated on a polyethylene terephthalate film (Lumirror T, thickness 25 μm, manufactured by Toray Industries, Inc.) as a transfer support, and the coating was dried to form a photosensitive conductive paste layer (thickness 12 μm). Subsequently, the above photosensitive black conductive paste was gravure-coated thereon, and the coating was dried to laminate a photosensitive black conductive paste layer (thickness 8 μm) onto the photosensitive conductive paste layer, thereby preparing a transfer sheet (having a structure shown in FIG. 11).

Thereafter, the above transfer sheet was used to transfer the photosensitive conductive paste layer and the photosensitive black conductive layer onto a glass substrate with a patterned transparent electrode (line width 150 μm) of indium tin oxide (ITO) formed thereon (corresponding to FIG. 14A). In this case, the transfer was performed by bringing the transfer sheet into contact with the glass substrate by pressure at 100° C.

Thereafter, ultraviolet light was applied through a mask having an opening of line with 80 μm to expose at a time the photosensitive conductive paste layer and the photosensitive black conductive layer (corresponding to FIG. 14B).

Development was then performed with an aqueous 0.5% Na₂CO₃ solution, followed by firing at a peak temperature of 570° C. to form an electrode having a two layer structure of a black conductive layer and a main conductive layer (line width 70 μm, thickness 8 μm) on the ITO transparent electrode (corresponding to FIG. 14C).

A plasma display panel was prepared using the glass substrate with an electrode, having a two layer structure, formed on an ITO transparent electrode. As a result, the plasma display panel had high display contrast and color purity and excellent display quality.

Example D2

At the outset, the photosensitive black conductive paste prepared in Example 1 was roll-coated on a polyethylene terephthalate film (Lumirror T, thickness 12 μm, manufactured by Toray Industries, Inc.) as a transfer support, and the coating was dried to form a photosensitive black conductive paste layer (thickness 10 μm), thereby preparing a transfer sheet A (having a structure shown in FIG. 12).

Separately, the photosensitive conductive paste prepared in Example D1 was coated by Komma coating on a polyethylene terephthalate film (Lumirror T, thickness 25 μm, manufactured by Toray Industries, Inc.) as a transfer support by Komma coating, and the coating was dried to form a photosensitive conductive paste layer (thickness 15 μm), thereby preparing a transfer sheet B (having a structure shown in FIG. 13).

Thereafter, the transfer sheet A in its photosensitive black conductive paste layer side was brought into contact by pressure with a patterned transparent electrode (line Width 150 μm) of indium tin oxide (ITO) formed thereon, and ultraviolet light was applied through a mask having an opening of line with 50 μm to expose the photosensitive black conductive paste layer (corresponding to FIG. 21A). Thereafter, the transfer support was separated and removed, thus transferring the photosensitive black conductive paste layer.

The transfer sheet B in its photosensitive conductive paste layer side was then brought into contact by pressure with the surface of the photosensitive black conductive paste layer, and ultraviolet light was applied through a mask having an opening of line width 50 μm to expose the photosensitive conductive paste layer (corresponding to FIG. 21B). Thereafter, the transfer support was separated and removed, thus transferring the photosensitive conductive paste layer. In this case, the mask used had an opening which overlaps with the opening of the mask used in the exposure of the photosensitive black conductive paste layer.

Development was then performed with an aqueous 0.5% $Na_2CO_3$ solution, followed by firing at a peak temperature of 570° C. to form an electrode having a two layer structure of a black conductive layer and a main conductive layer (line width 40 μm, thickness 12 μm) on the ITO transparent electrode (corresponding to FIG. 21C).

A plasma display panel was prepared using the glass substrate with an electrode, having a two layer structure, formed on an ITO transparent electrode. As a result, the plasma display panel had high display contrast and color purity and excellent display quality.

The above Example D1 used the transfer sheet of the first invention and was carried out by the method for electrode formation according to the first invention, and example D2 used the transfer sheet of the fourth invention and the transfer sheet of the sixth invention and was carried out by the method for electrode formation according to the eighth invention. However, it is a matter of course that the use of the other transfer sheets of the present invention and the practice according the other electrode formation methods of the present invention also can provide a plasma display panel having markedly decreased electric resistance of the ITO transparent electrode, high display contrast and color purity and excellent display quality.

As is apparent from the foregoing detailed description, according to the present invention, a transfer sheet comprising a transfer support having thereon a photosensitive black conductive paste layer containing a black pigment and a photosensitive conductive paste layer, or alternatively a combination of a transfer sheet comprising a transfer support having thereon a photosensitive black conductive paste layer containing a black pigment and a transfer sheet comprising a transfer support having thereon a photosensitive conducive paste layer is used to form an electrode (a bus electrode) having a two layer structure of a black conductive layer and a main conductive layer on a transparent electrode in an insulating substrate. The main conductive layer in the electrode having a two layer structure decreases the electric resistance of the transparent electrode, while the black conductive layer permits the main conductive layer to be connected to the transparent electrode and, at the same time, can enhance the contrast and color purity of the display panel. The above construction of the electrode can realize high display quality even in a high-definition or large-area plasma display panel. Further, the present invention can advantageously eliminate the need to use any photoresist and, hence, simplifies the process and, in addition, has the effect of offering higher electrode formation accuracy than the printing method.

What is claimed is:

1. A transfer sheet for an electrode of a plasma display panel, comprising: a transfer support; a photosensitive conductive paste layer separably provided on the transfer support; and a photosensitive black conductive paste layer, containing a black pigment, provided on the photosensitive conductive paste layer.

2. The transfer sheet according to claim 1, wherein the transfer support is permeable to light.

3. A process for producing an electrode of a plasma display panel, comprising the steps of: transferring a photosensitive black conductive paste layer and a photosensitive conductive paste layer onto an insulating substrate using the transfer sheet for an electrode according to claim 1 or 2; exposing the photosensitive black conductive paste layer and the photosensitive conductive paste layer through a mask having a predetermined pattern; developing the exposed photosensitive black conductive paste layer and the exposed photosensitive conductive paste layer; and performing firing to form an electrode having a two layer structure of a black conductive layer and a main conductive layer.

4. A process for producing an electrode of a plasma display panel, comprising the steps of: bringing the photosensitive black conductive paste layer side of the transfer sheet for an electrode according to claim 2 into contact with the surface of an insulating substrate by pressure; exposing the photosensitive black conductive paste layer and the photosensitive conductive paste layer from above the transfer support through a mask having a predetermined pattern; separating and removing the transfer support; and performing development and firing to form an electrode having a two layer structure of a black conductive layer and a main conductive layer.

5. A process for producing an electrode of a plasma display panel, comprising the steps of: exposing the photosensitive black conductive paste layer and the photosensitive conductive paste layer of the transfer sheet for an electrode according to claim 1 or 2 through a mask having a predetermined pattern; transferring the photosensitive black conductive paste layer and the photosensitive conductive paste layer of the transfer sheet onto an insulating substrate; and developing and firing the transferred photosensitive black conductive paste layer and photosensitive conductive paste layer to form an electrode having a two layer structure of a black conductive layer and a main conductive layer.

6. A process for producing an electrode of a plasma display panel, comprising the steps of: exposing the photosensitive black conductive paste layer and the photosensitive conductive paste layer of the transfer sheet for an electrode according to claim 1 or 2 through a mask having a predetermined pattern; developing the exposed photosensitive black conductive paste layer and the exposed photosensitive conductive paste layer to form a black conductive layer pattern and a main conductive layer pattern; transferring the black conductive layer pattern and the main conductive layer pattern in the transfer sheet onto an insulting substrate; and then performing firing to form an electrode having a two layer structure of a black conductive layer and a main conductive layer.

7. A process for producing an electrode of a plasma display panel, comprising the steps of: transferring a photosensitive black conductive paste layer onto a transparent electrode, provided on an insulating substrate, using a transfer sheet for an electrode, said transfer sheet comprising (a) a transfer support and (b) a photosensitive black conductive paste layer containing a black pigment and separably provided on (a); transferring a photosensitive conductive paste layer onto the photosensitive black conductive paste layer using a transfer sheet for an electrode comprising (1) a transfer support and (2) a photosensitive black conductive paste layer containing a black pigment and separably provided on (1); exposing the transferred photosensitive black conductive paste layer and photosensitive conductive paste layer through a mask having a predetermined pattern; developing the exposed photosensitive black conductive paste layer and photosensitive conductive paste layer; and performing firing to form an electrode having a two layer structure of a black conductive layer and a main conductive layer.

8. A process for producing an electrode of a plasma display panel, comprising the steps of: transferring a photosensitive black conductive paste layer onto an insulating substrate using a transfer sheet for an electrode, said transfer sheet comprising (a) a light permeable transfer support and (b) a photosensitive black conductive paste layer containing a black pigment and separably provided on (b); bringing the photosensitive conductive paste layer side of a transfer sheet for an electrode, comprising (i) a transfer support that is permeable to light and (2) a photosensitive black conductive paste layer containing a black pigment and separably provided on (1) into contact with the top surface of the photosensitive black conductive paste layer by pressure; exposing the photosensitive black conductive paste layer and the photosensitive conductive paste layer from above the transfer support through a mask having a predetermined pattern; separating and removing the transfer support; and performing development and then firing to form an electrode having a two layer structure of a black conductive layer and a main conductive layer.

9. A process for producing an electrode of a plasma display panel, comprising the steps of: transferring a photosensitive black conductive paste layer onto an insulating substrate using the transfer sheet for an electrode, said transfer sheet comprising (a) a transfer support and (b) a photosensitive black conductive paste layer containing a black pigment and separably provided on (a); exposing the transferred photosensitive black conductive paste layer through a mask having a predetermined pattern; transferring a photosensitive conductive paste layer onto the photosensitive black conductive paste layer using a transfer sheet for an electrode comprising (1) a transfer support and (2) a photosensitive black conductive paste layer containing a black pigment and separably provided on (1); exposing the photosensitive conductive paste layer through a mask having a predetermined pattern; and performing development and then firing to form an electrode having a two layer structure of a black conductive layer and a main conductive layer.

10. A process for producing an electrode of a plasma display panel, comprising the steps of: bringing a photosensitive black conductive paste layer side of a transfer sheet for an electrode, said transfer sheet comprising (a) a light :permeable transfer support and (b) a photosensitive black conductive paste layer containing a black pigment and separably provided on (b) into contact with the surface of an insulating substrate by pressure; exposing the photosensitive black conductive paste layer from the top of the transfer support through a mask having a predetermined pattern; separating and removing the transfer support; bringing the photosensitive conductive paste layer side of a transfer sheet for an electrode comprising (i) a transfer support that is permeable to light and (2) a photosensitive black conductive paste layer containing a black pigment and separably provided on (1) into contact with the photosensitive black conductive paste layer by pressure; exposing the photosensitive conductive paste layer from above the transfer support through a mask having a predetermined pattern; separating and removing the transfer support; and performing development and then firing to form an electrode having a two layer structure of a black conductive layer and a main conductive layer.

11. A process for producing an electrode of a plasma display panel, comprising the steps of: transferring a photosensitive black conductive paste layer onto an insulating substrate using the transfer sheet for an electrode, said transfer sheet comprising (a) a transfer support and (b) a photosensitive black conductive paste layer containing a black pigment and separably provided on (a); exposing the transferred photosensitive black conductive paste layer through a mask having a predetermined pattern; developing the exposed photosensitive black conductive paste layer to form a black conductive layer pattern; transferring a photosensitive conductive paste layer using a transfer sheet for an electrode comprising (1) a transfer support and (2) a photosensitive black conductive paste layer containing a black pigment and separably provided on (1) so as to cover the black conductive layer; exposing the photosensitive conductive paste layer through a mask having a predetermined pattern; developing the exposed photosensitive conductive paste layer to form a main conductive layer pattern; and then performing firing to form an electrode having a two layer structure of a black conductive layer and a main conductive layer.

12. A process for producing an electrode of a plasma display panel, comprising the steps of; bringing a photosensitive black conductive paste layer Side of a transfer sheet for an electrode, said transfer sheet comprising (a) a light permeable transfer support and (b) a photosensitive black conductive paste layer containing a black pigment and separably-provided on (b) into contact with the surface of an insulating substrate by pressure; exposing the photosensitive black conductive paste layer from above the transfer support through a mask having a predetermined pattern; separating and removing the transfer support; developing the photosensitive black conductive paste layer to form a black conductive layer pattern; bringing the photosensitive conductive paste layer side of a transfer sheet for an electrode comprising (i) a transfer support that is permeable to light and (2) a photosensitive black conductive paste layer containing a black pigment and separably provided on (1) into contact with the black conductive layer pattern by pressure so as to cover the black conductive layer; exposing the photosensitive conductive paste layer from above the transfer support through a mask having a predetermined pattern; separating and removing the transfer support: developing the photosensitive conductive paste layer to form a main conductive layer pattern; and performing firing to form an electrode having a two layer structure of a black conductive layer and a main conductive layer.

13. A process for producing an electrode of a plasma display panel, comprising the steps of: exposing a photosensitive black conductive paste layer in a transfer sheet for an electrode, said transfer sheet comprising (a) a transfer support and (b) a photosensitive black conductive paste layer containing a black pigment and separably provided on (a) through a mask having a predetermined pattern; transferring the photosensitive black conductive paste layer in the transfer sheet onto an insulating substrate; exposing the photosensitive conductive paste layer in a transfer sheet for an electrode comprising (1) a transfer support and (2) a photosensitive black conductive paste layer containing a black pigment and separably provided on (1) through a mask having a predetermined pattern; transferring the photosensitive conductive paste layer onto the photosensitive black conductive paste layer; and performing development and firing to form an electrode having a two layer structure of a black conductive layer and a main conductive layer.

14. A process for producing an electrode of a plasma display panel, comprising the steps of: exposing a photosensitive black conductive paste layer in a transfer sheet for an electrode, said transfer sheet comprising (a) a transfer support and (b) a photosensitive black conductive paste layer containing a black pigment and separably provided on (a) through a mask having a predetermined pattern; developing the exposed photosensitive black conductive paste layer to form a black conductive layer pattern; transferring the black conductive layer pattern in the transfer sheet onto an insulating substrate; exposing the photosensitive conductive paste layer in a transfer sheet for an electrode comprising (1) a transfer support and (2) a photosensitive black conductive paste layer containing a black pigment and separably provided on (1) through a mask having a predetermined pattern; developing the exposed photosensitive conductive paste layer to form a main conductive layer pattern; transferring the main conductive layer pattern in the transfer sheet onto the black conductive layer pattern; and performing firing to form an electrode having a two layer structure of a black conductive layer and main conductive layer.

15. The process of claim 7 wherein said transfer support is permeable to light.

16. The process of claim 8 wherein said transfer support is permeable to light.

17. The process of claim 9 wherein said transport support is permeable to light.

18. The process of claim 11 wherein said transport support is permeable to light.

19. The process of claim 13 wherein said transport support is permeable to light.

20. The process of claim 14 wherein said transport support is permeable to light.

* * * * *